(12) United States Patent
Arai

(10) Patent No.: US 11,404,362 B2
(45) Date of Patent: Aug. 2, 2022

(54) WIRING SUBSTRATE AND SEMICONDUCTOR DEVICE

(71) Applicant: SHINKO ELECTRIC INDUSTRIES CO., LTD., Nagano (JP)

(72) Inventor: Takashi Arai, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 140 days.

(21) Appl. No.: 16/419,597

(22) Filed: May 22, 2019

(65) Prior Publication Data

US 2019/0371715 A1 Dec. 5, 2019

(30) Foreign Application Priority Data

May 31, 2018 (JP) .............................. JP2018-105409

(51) Int. Cl.
*H01L 29/40* (2006.01)
*H01L 23/498* (2006.01)
(Continued)

(52) U.S. Cl.
CPC .... *H01L 23/49811* (2013.01); *H01L 21/4853* (2013.01); *H01L 23/49827* (2013.01);
(Continued)

(58) Field of Classification Search
CPC .......... H01L 21/4853; H01L 23/49811; H01L 23/49827; H01L 23/49866; H01L 24/32; H01L 2224/32238
(Continued)

(56) References Cited

U.S. PATENT DOCUMENTS 4,434,430 A * 2/1984 Koto .................... B41J 2/14233
347/20
6,133,136 A * 10/2000 Edelstein ................ H01L 24/05
438/618
(Continued)

FOREIGN PATENT DOCUMENTS

JP 2009-253147 A 10/2009
JP 2010129996 A 6/2010
(Continued)

OTHER PUBLICATIONS

Office Action issued in corresponding Japanese Patent Application No. 2018-105409 dated Dec. 1, 2021.
(Continued)

*Primary Examiner* — Ori Nadav
(74) *Attorney, Agent, or Firm* — Tarolli, Sundheim, Covell & Tummino LLP

(57) ABSTRACT

A wiring substrate includes a wiring layer and an insulation layer covering the wiring layer. The insulation layer includes an opening partially exposing the wiring layer. A seed layer continuously covers a wall surface of the opening and an upper surface of the insulation layer. The wiring substrate also includes a metal layer, a metal post, and an outer coating plating layer. The opening is filled with the seed layer and the metal layer formed on the seed layer. The metal post is formed on the metal layer and on the seed layer that is located on the insulation layer. The outer coating plating layer includes an upper portion, entirely covering an upper surface of the metal post, and a side portion, entirely covering a side surface of the metal post and exposing an outer end surface of the seed layer. The side portion is thinner than the upper portion.

12 Claims, 20 Drawing Sheets

(51) Int. Cl.
   *H01L 23/00*   (2006.01)
   *H01L 21/48*   (2006.01)

(52) U.S. Cl.
   CPC ........ *H01L 24/32* (2013.01); *H01L 23/49866* (2013.01); *H01L 2224/32238* (2013.01)

(58) Field of Classification Search
   USPC .................................................. 257/734–737
   See application file for complete search history.

(56) References Cited

U.S. PATENT DOCUMENTS

| | | | | |
|---|---|---|---|---|
| 7,008,867 | B2* | 3/2006 | Lei | H01L 24/03 |
| | | | | 257/E21.508 |
| 9,620,468 | B2* | 4/2017 | Lin | H01L 24/11 |
| 9,905,522 | B1* | 2/2018 | Lin | H01L 21/324 |
| 2002/0185733 | A1* | 12/2002 | Chow | H01L 24/03 |
| | | | | 257/737 |
| 2005/0258540 | A1* | 11/2005 | Minda | H01L 24/03 |
| | | | | 257/738 |
| 2006/0017171 | A1* | 1/2006 | Weng | H01L 24/13 |
| | | | | 257/766 |
| 2010/0109159 | A1* | 5/2010 | Ho | H01L 24/13 |
| | | | | 257/737 |
| 2011/0260317 | A1* | 10/2011 | Lu | H01L 24/11 |
| | | | | 257/737 |
| 2016/0020163 | A1 | 1/2016 | Shimizu | |
| 2017/0141023 | A1* | 5/2017 | Arisaka | H01L 24/13 |
| 2017/0141059 | A1 | 5/2017 | Shih | |

FOREIGN PATENT DOCUMENTS

| | | |
|---|---|---|
| JP | 2014225632 A | 12/2014 |
| JP | 2016-029697 A | 3/2016 |
| JP | 2016-127222 A | 7/2016 |

OTHER PUBLICATIONS

Office Action issued in corresponding Japanese Patent Application No. 2018-105409 dated Jun. 21, 2022.

\* cited by examiner

Fig.19A (Reference Example)
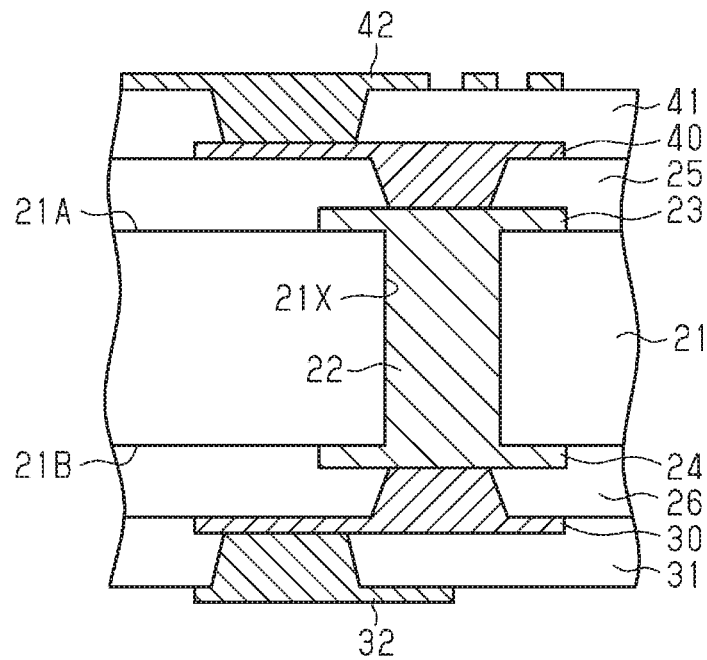
Fig.19B (Reference Example)
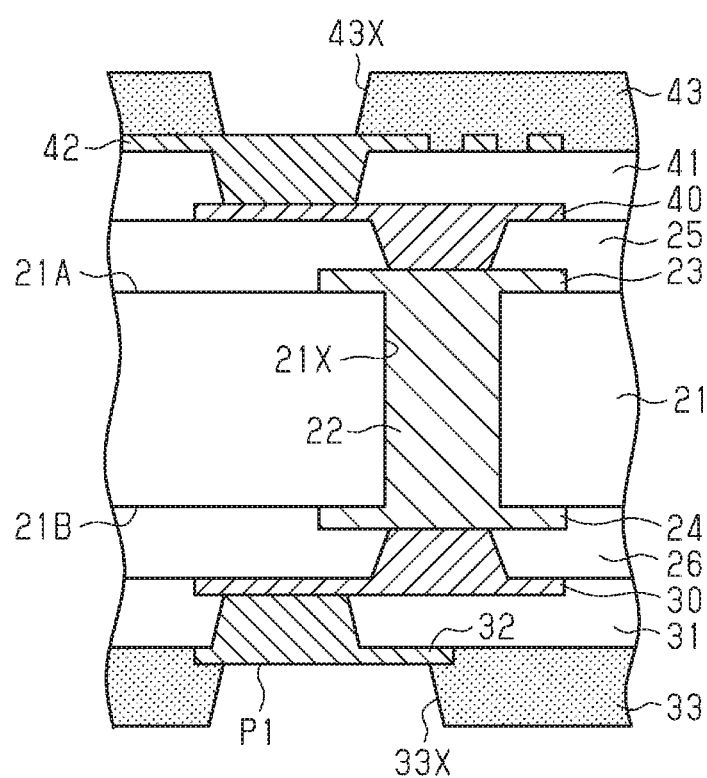

Fig.20A (Reference Example)
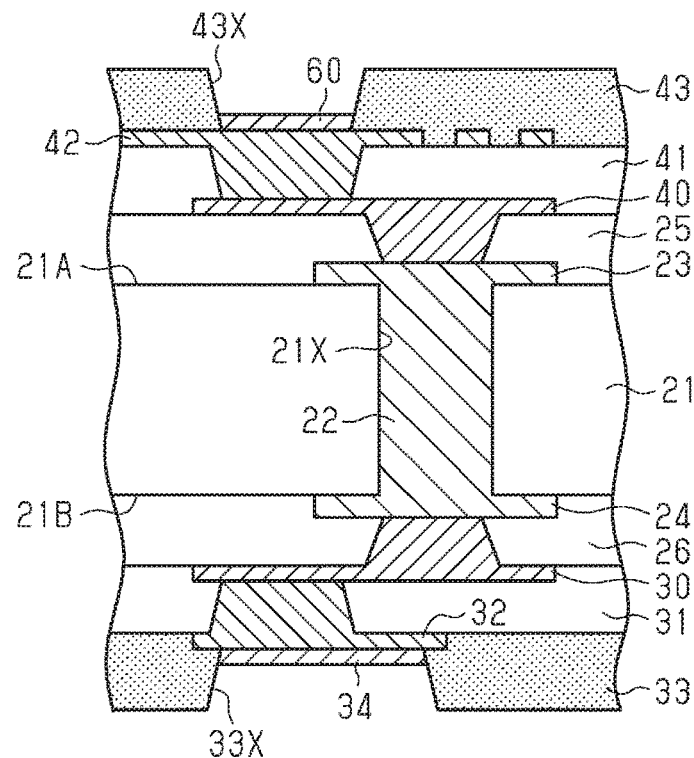
Fig.20B (Reference Example)
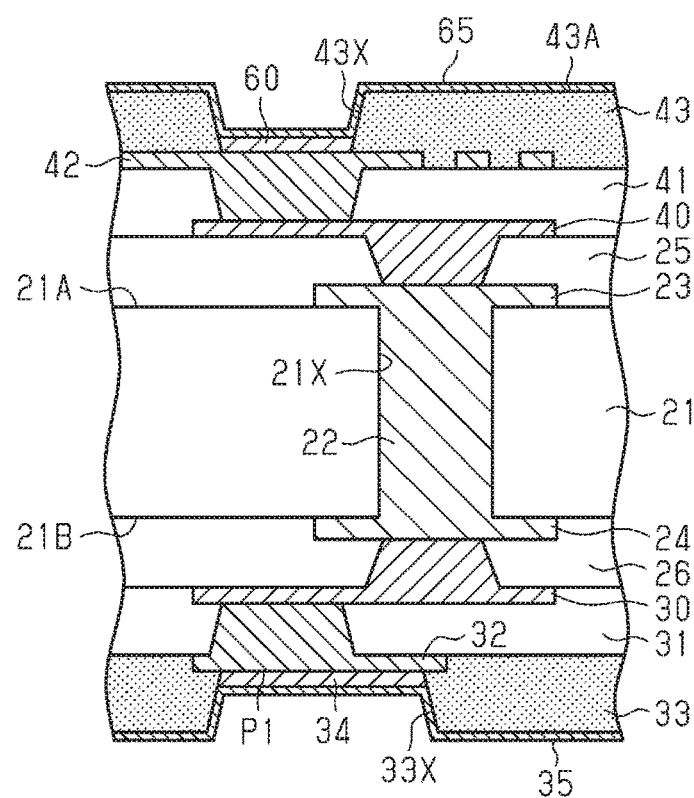

Fig.21A (Reference Example)
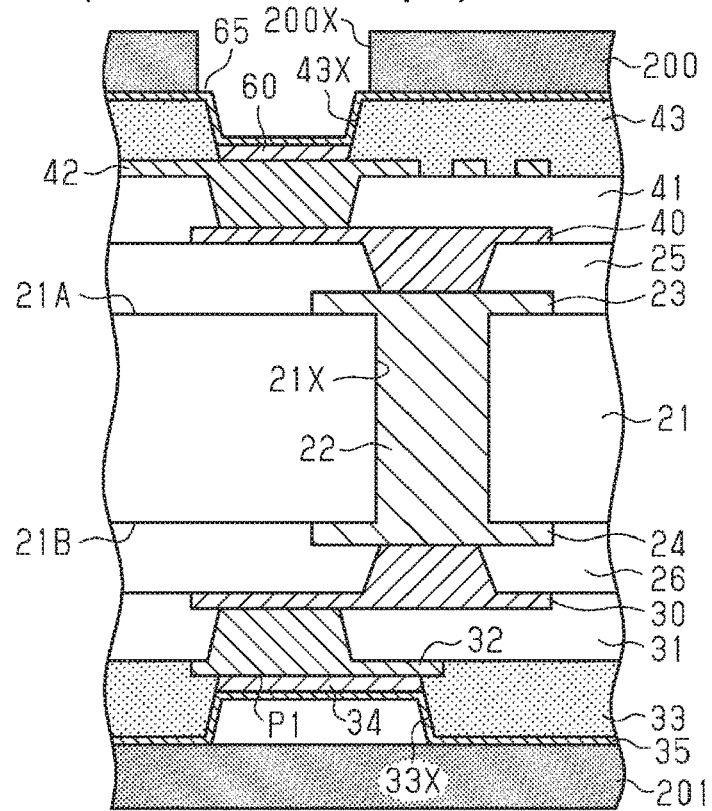
Fig.21B (Reference Example)
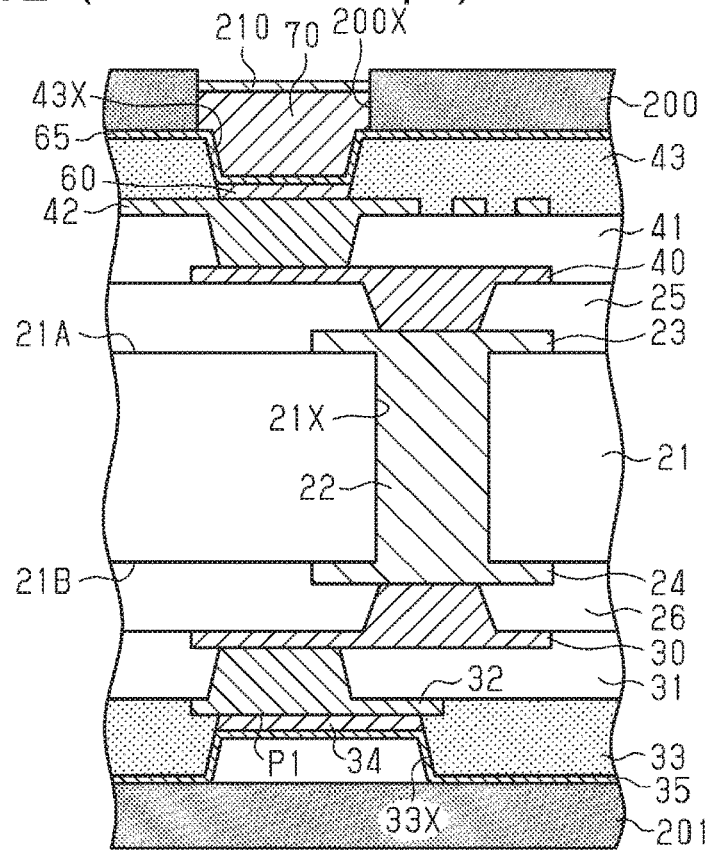

Fig.22A (Reference Example)
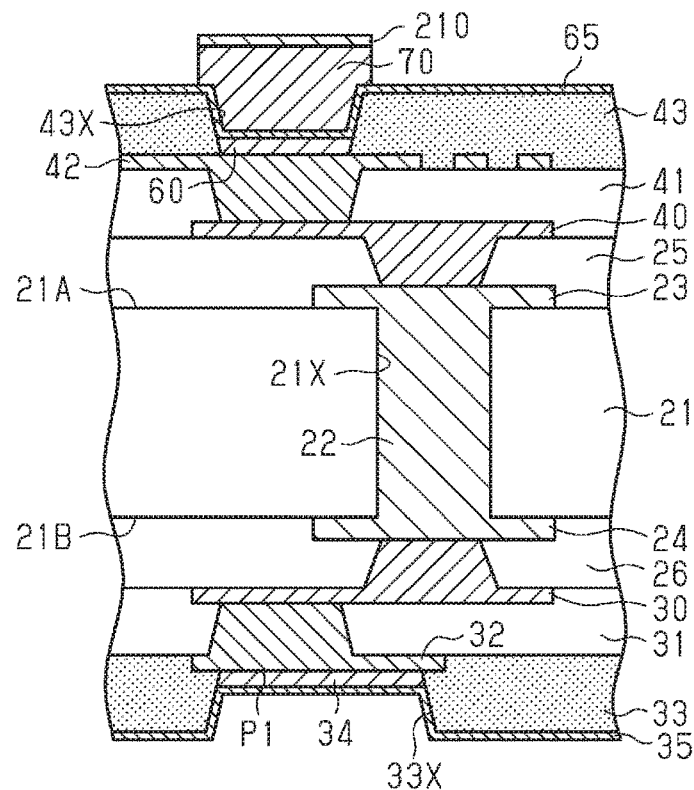
Fig.22B (Reference Example)
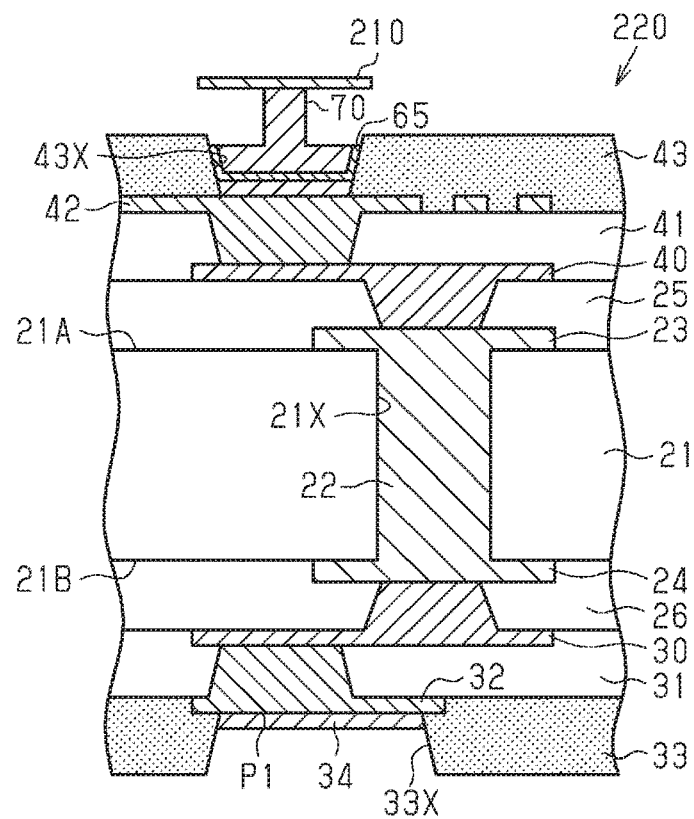

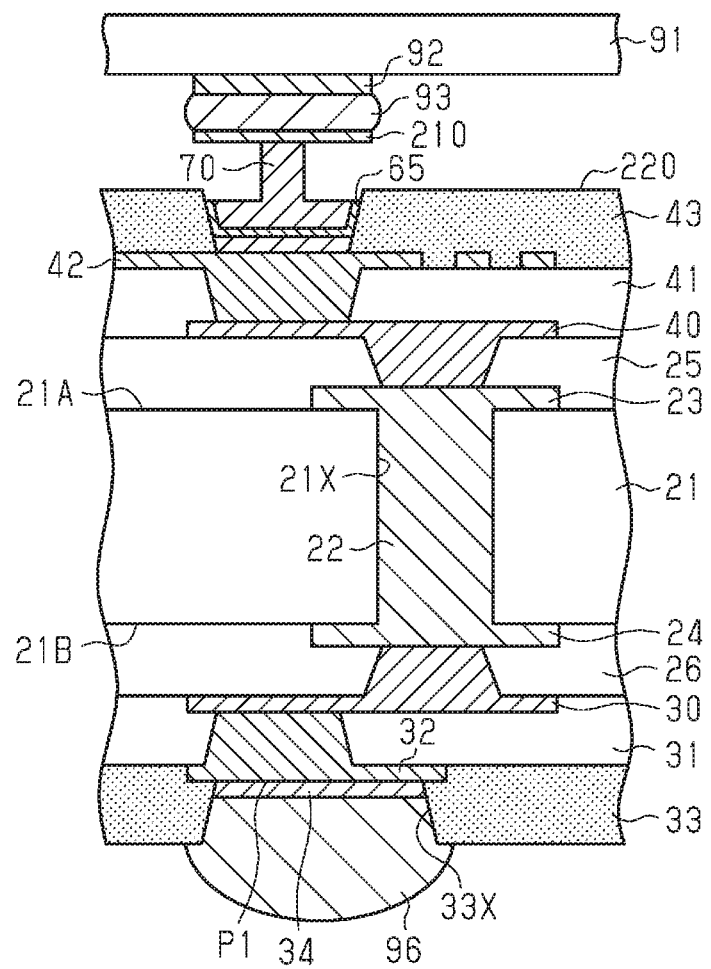
Fig.23 (Reference Example)

WIRING SUBSTRATE AND SEMICONDUCTOR DEVICE

CROSS-REFERENCE TO RELATED APPLICATIONS

This application is based upon and claims the benefit of priority from prior Japanese Patent Application No. 2018-105409, filed on May 31, 2018, the entire contents of which are incorporated herein by reference.

FIELD

This disclosure relates to a wiring substrate, a semiconductor device, and a method for manufacturing a wiring substrate.

BACKGROUND

Wiring substrates for mounting electronic components such as semiconductor elements have been proposed in similar shapes and structures. Semiconductor elements have become highly integrated and highly sophisticated. This has resulted in a demand for miniaturization of the wiring on wiring substrates for semiconductor elements. A wiring substrate that meets such a demand includes an insulation layer formed on a base substrate on which a wiring pattern is formed. Metal posts (cylindrical connection terminals) are formed on the insulation layer from which the wiring pattern is exposed (Japanese Laid-Open Patent Publication Nos. 2014-225632 and 2010-129996).

When the metal posts are formed from copper, if the surfaces of the metal posts are exposed to the outside, the surfaces of the metal posts easily oxidize. Oxidation of the metal posts lowers the reliability of the connection between the metal posts and the connection terminals of electronic components such as the semiconductor elements mounted on the wiring substrate.

SUMMARY

A wiring substrate in accordance with one embodiment includes a wiring layer. The wiring substrate also includes an insulation layer covering the wiring layer and including an opening that partially exposes an upper surface of the wiring layer. The wiring substrate also includes a seed layer continuously covering a wall surface of the opening and an upper surface of the insulation layer. The wiring substrate also includes a metal layer formed by an electrolytic copper plating layer on the seed layer located in the opening. The opening is filled with the seed layer and the metal layer. The wiring substrate also includes a metal post formed by an electrolytic copper plating layer on an upper surface of the metal layer and on the seed layer that is located on the upper surface of the insulation layer. The wiring substrate further includes an outer coating plating layer exposing an outer end surface of the seed layer located on the upper surface of the insulation layer. The outer coating plating layer includes an upper portion entirely covering an upper surface of the metal post and a side portion entirely covering a side surface of the metal post. The side portion is thinner than the upper portion.

Other embodiments and advantages thereof will become apparent from the following description, taken in conjunction with the accompanying drawings, illustrating by way of example the principles of the invention.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIGS. 19A, 19B, 20A, 20B, 21A, 21B, 22A, 22B, and 23 are schematic cross-sectional views illustrating a method for manufacturing a wiring substrate of a reference example.

DESCRIPTION OF THE EMBODIMENTS

Figure 1A:
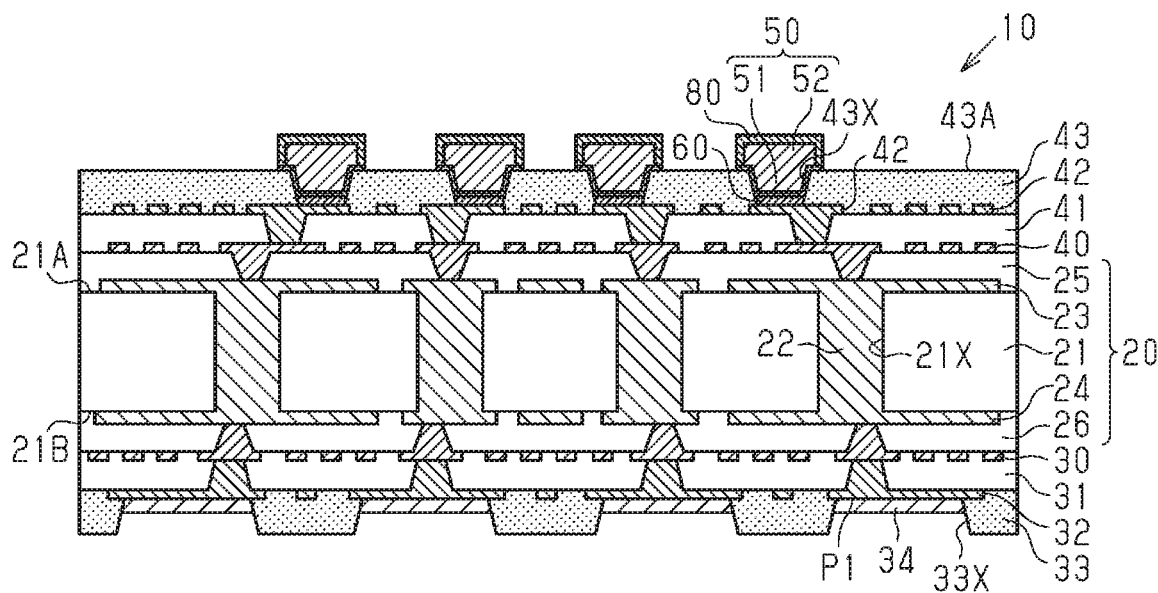
FIG. 1A is a schematic cross-sectional view of a wiring substrate in accordance with a first embodiment.

Embodiments will now be described with reference to the drawings. In the drawings, elements are illustrated for simplicity and clarity and have not necessarily been drawn to scale. To facilitate understanding, hatching lines may not be illustrated or be replaced by shadings in the cross-sectional drawings. In this specification, a plan view refers to a view taken in a vertical direction (e.g., vertical direction as viewed in FIG. 1A), and a planar shape refers to a shape of a subject as viewed in the vertical direction, that is, in a plan view.

REFERENCE EXAMPLE

Before describing various embodiments, a method for manufacturing a wiring substrate 220 (refer to FIG. 22B) of a reference example will first be described.

With reference to FIG. 19A, a core substrate 21 including an upper surface 21A and a lower surface 21B is prepared. Drilling or the like is performed to form through holes 21X in the core substrate 21. The core substrate 21 may be, for example, a glass epoxy substrate obtained by impregnating a glass cloth with epoxy resin.

Each through hole 21X is filled with plating to form a through electrode 22. Then, for example, a subtractive process is performed to form wiring patterns 23 and 24 on the upper surface 21A and the lower surface 21B of the core substrate 21, respectively. The wiring patterns 23 and 24 are connected to the through electrode 22. A resin film is vacuum-laminated on each of the upper surface 21A and lower surface 21B of the core substrate 21. The resin film is then heated and hardened to form insulation layers 25 and 26. The insulation layers 25 and 26 may be formed by applying and heating a paste or liquid of resin. Through holes are formed in each of the insulation layers 25 and 26, and a desmear process is performed when necessary. Then, for example, a semi-additive process is performed to form wiring layers 30 and 40 on the insulation layers 25 and 26, respectively. An insulation layer 31 and a wiring layer 32 are stacked on a lower surface of the insulation layer 26, and an insulation layer 41 and a wiring layer 42 are stacked on the upper surface of the insulation layer 25.

The lowermost wiring layer 32 is electrically connected by the wiring patterns 23 and 24, the wiring layers 30 and 40, and the through electrode 22 to the uppermost wiring layer 42.

In the step illustrated in FIG. 19B, a solder resist layer 43 is formed on the upper surface of the insulation layer 41. The solder resist layer 43 includes an opening 43X partially exposing the upper surface of the wiring layer 42. In the same manner, a solder resist layer 33 is formed on the lower surface of the insulation layer 31. The solder resist layer 33 includes an opening 33X partially exposing the lower surface of the wiring layer 32 as an external connection pad P1.

In the step of FIG. 20A, an electroless plating process is performed to form diffusion prevention layers 34 and 60 on the wiring layers 32 and 42 exposed in the openings 33X and 43X of the solder resist layers 33 and 43, respectively.

In the step illustrated in FIG. 20B, a seed layer 35 is formed covering the entire wall surface of the opening 33X and the entire lower surface of the solder resist layer 33. In the same manner, a seed layer 65 is formed covering the entire wall surface of the opening 43X and the entire upper surface of the solder resist layer 43. The seed layers 35 and 65 are formed by, for example, performing an electroless copper plating process.

In the step illustrated in FIG. 21A, a dry film resist is applied to each of the seed layers 65 and 35 to form plating resist layers 200 and 201. Then, the plating resist layer 200 is exposed and developed to form an opening pattern 200X that is communication with the opening 43X. The plating resist layer 201 is left covering the entire lower surface of the seed layer 35 without undergoing patterning.

In the step illustrated in FIG. 21B, electrolytic copper plating is performed using the seed layer 65 as a power supplying layer to form a metal post 70 of an electrolytic copper plating layer on the seed layer 65 exposed in the opening pattern 200X.

Then, an electrolytic plating process is performed to form a surface-processed layer 210 on the upper surface of the metal post 70. The surface-processed layer 210 is an electrolytic plating metal layer formed from a metal differing from the material of the metal post 70 (copper). The surface-processed layer 210 has the structure of a stack formed by stacking a nickel (Ni) layer, which serves as a bottom layer, a palladium (Pd) layer, and a gold (Au) layer in this order on the upper surface of the metal post 70.

In the step illustrated in FIG. 22A, the plating resist layers 200 and 201 are delaminated. This exposes the side surface of the metal post 70 and the side surface of the surface-processed layer 210 to the outside.

In the step illustrated in FIG. 22B, wet etching is performed to remove the unnecessary seed layers 35 and 65 from the solder resist layers 33 and 43 and the opening 33X using sulfuric acid peroxide as an etching liquid. When performing etching, the metal post 70 and the surface-processed layer 210, which is formed from a metal that differs in type from the metal forming the metal post 70, are exposed to the etching liquid. In this case, the ionization tendency differs between the metal post 70 and the surface-processed layer 210. This results in galvanic corrosion between the metal post 70 and the surface-processed layer 210, which is electrically connected to the metal post 70.

Galvanic corrosion occurs when a local cell is formed by two metals submerged in an electrolytic solution have different ionization tendencies. This causes corrosion of the metal having the larger ionization tendency. In this example, the metal post 70 (copper layer) has a larger ionization tendency than the Au layer of the surface-processed layer 210. Thus, the side surface of the metal post 70 is over-etched in the etching liquid, and the metal post 70 becomes extremely thin. The wiring substrate 220 of the reference example is manufactured through the manufacturing process described above.

In the step illustrated in FIG. 23, a connection terminal 92 of a semiconductor element 91 is flip-chip-bonded to the surface-processed layer 210 of the wiring substrate 220. For example, while pressing the semiconductor element 91 against the wiring substrate 220, the connection terminal 92 of the semiconductor element 91 is connected by a solder layer 93 to the surface-processed layer 210 on the metal post 70. Further, when necessary, an external connection terminal 96 is formed on the diffusion prevention layer 34, which is located on the external connection pad P1.

As described above, in the method for manufacturing the wiring substrate 220 of the reference example, when performing wet etching to remove the seed layers 35 and 65 (refer to FIG. 22A) in the step of FIG. 22B, galvanic corrosion results in over-etching of the metal post 70. This decreases the strength of the metal post 70. Thus, the pressure applied to mount the semiconductor element 91 on the wiring substrate 220 may bend the metal post 70 in the step of FIG. 23 or, in the worst case, cause loss of the metal post 70 in the step of FIG. 22B. This decreases the connection reliability of the wiring substrate 220 and the semiconductor element 91.

Various embodiments that improve the connection reliability between the wiring substrate and the semiconductor element will be described hereafter.

First Embodiment

A wiring substrate 10 in accordance with a first embodiment will now be described with reference to FIGS. 1A to 7B.

The structure of the wiring substrate 10 will first be described.

With reference to FIG. 1A, the wiring substrate 10 includes a substrate body 20 located near the center of the wiring substrate 10 in the thickness-wise direction. The substrate body 20 includes the core substrate 21, the through electrodes 22, and the wiring patterns 23 and 24. The through holes 21X extending through the core substrate 21 in the thickness-wise direction are filled with the through electrodes 22. The wiring patterns 23 and 24 are respectively formed on the upper surface 21A and the lower surface 21B of the core substrate 21. The wiring patterns 23 and 24 are electrically connected by the through electrodes 22. The substrate body 20 includes the insulation layer 25, which covers the wiring pattern 23 formed on the upper surface 21A of the core substrate 21, and the insulation layer 26, which covers the wiring pattern 24 formed on the lower surface 21B of the core substrate 21.

The material of the core substrate 21 may be, for example, an insulative resin including a reinforcement material and formed by impregnating a woven cloth or non-woven cloth of glass fibers, aramid fibers, or liquid crystal polymer (LCP) fibers with an epoxy or polyimide thermosetting insulative resin. The material of the through electrodes 22 and the wiring patterns 23 and 24 may be, for example, copper (Cu) or a copper alloy. The material of the insulation layers 25 and 26 may be, for example, an organic resin, such as an epoxy resin or a polyimide resin, or a resin material obtained by mixing filler such as silica or alumina with such a thermosetting resin.

The wiring layer 30 is formed on the lower surface of the insulation layer 26. The wiring layer 30 includes via wiring, which extends through the insulation layer 26 in the thickness-wise direction, and a wiring pattern, which is formed on the lower surface of the insulation layer 26. The via wiring of the wiring layer 30 electrically connects the wiring pattern of the wiring layer 30 to the wiring pattern 24.

The insulation layer 31, which covers the wiring layer 30, is formed on the lower surface of the insulation layer 26. The wiring layer 32 is formed on the lower surface of the insulation layer 31. The wiring layer 32 includes via wiring, which extends through the insulation layer 31 in the thickness-wise direction, and a wiring pattern, which is formed on the lower surface of the insulation layer 31. The via wiring of the wiring layer 32 electrically connects the wiring pattern of the wiring layer 32 to the wiring pattern of the wiring layer 30.

The solder resist layer 33, which covers the wiring layer 32, is formed on the lower surface of the insulation layer 31. The material of the solder resist layer 33 may be, for example, an insulative resin of which the main component is a photosensitive insulative resin such as a phenol resin or a polyimide resin. The solder resist layer 33 may include, for example, filler such as silica or alumina. The material of the solder resist layer 33 is not limited to an insulative resin of which the main component is a photosensitive insulative resin and may be, for example, the same insulative material as the insulation layers 25 and 26. The solder resist layer 33 includes a plurality of openings 33X partially exposing the lower surface of the wiring layer 32 as external connection pads P1.

The diffusion prevention layer 34 is formed on the external connection pads P1. The diffusion prevention layer 34 is, for example, a metal multilayer formed by using a nickel (Ni) layer as a bottom layer and stacking the Ni layer, a palladium (Pd) layer, and a gold (Au) layer in this order on the external connection pads P1. Other examples of the diffusion prevention layer 34 include an Au layer and an Ni layer/Au layer (metal layer in which Ni layer serves as bottom layer, with Ni layer and Au layer stacked in this order). The Ni layer, the Pd layer, and the Au layer are each formed by, for example, an electroless plating metal layer formed by performing an electroless plating process. The Ni layer is a metal layer formed from Ni or an Ni alloy, the Pd layer is a metal layer formed from Pd or a Pd alloy, and the Au layer is a metal layer formed from Au or an Au alloy. The diffusion prevention layer 34 formed on the external connection pads P1 may be used as external connection terminals.

The wiring layer 40 is formed on the upper surface of the insulation layer 25. The wiring layer 40 includes via wiring, which extends through the insulation layer 25 in the thickness-wise direction, and a wiring pattern, which is formed on the upper surface of the insulation layer 25. The via wiring of the wiring layer 40 electrically connects the wiring pattern of the wiring layer 40 to the wiring pattern 23.

The insulation layer 41, which covers the wiring layer 40, is formed on the upper surface of the insulation layer 25. The wiring layer 42 is formed on the upper surface of the insulation layer 41. The wiring layer 42 includes via wiring, which extends through the insulation layer 41 in the thickness-wise direction, and a wiring pattern, which is formed on the upper surface of the insulation layer 41. The via wiring of the wiring layer 42 electrically connects the wiring pattern of the wiring layer 42 to the wiring pattern of the wiring layer 40.

The solder resist layer 43, which covers the wiring layer 42, is formed on the upper surface of the insulation layer 41. The material of the solder resist layer 43 may be, for example, an insulative resin of which the main component is a photosensitive insulative resin such as a phenol resin or a polyimide resin. The solder resist layer 43 may contain, for example, filler such as silica or alumina. The material of the solder resist layer 43 is not limited to an insulative resin of which the main component is a photosensitive insulative resin and may be, for example, the same insulative material as the insulation layers 25 and 26.

The solder resist layer 43 includes the openings 43X extending through the solder resist layer 43 in the thickness-wise direction at given locations and partially exposing the upper surface of the wiring layer 42. Each opening 43X is tapered so that the diameter decreases from the upper side in FIG. 1A (upper surface 43A of solder resist layer 43) toward the lower side (upper surface of wiring layer 42). For example, the opening 43X has the form of a reversed truncated cone of which diameter at the upper open end is larger than the diameter at the lower open end.

A wiring layer 50 is formed on the upper surface 43A of the solder resist layer 43. The wiring layer 50 includes via wiring 51, which is formed in each opening 43X, and connection terminals 52, which project upward from the upper surface 43A of the solder resist layer 43.

In the present example, each opening 43X is filled with the via wiring 51. Thus, the via wiring 51 is shaped in conformance with the opening 43X. The connection terminals 52 are cylindrical connection terminals (metal posts) extending upward from the upper surface 43A of the solder resist layer 43. The connection terminals 52 function as electronic component mounting pads electrically connected to electronic components (not illustrated).

An outer coating plating layer 80 is formed on the upper surface and side surface of each connection terminal 52. The outer coating plating layer 80 entirely covers the upper surface of the connection terminal 52. The outer coating plating layer 80 continuously covers the upper surface and side surface of the connection terminal 52. The connection terminals 52 and the outer coating plating layer 80 are electrically connected to the wiring layer 32 by the via wiring 51, the wiring layer 42, the wiring layer 40, the wiring pattern 23, the through electrodes 22, the wiring pattern 24, and the wiring layer 30.

Figure 1B:
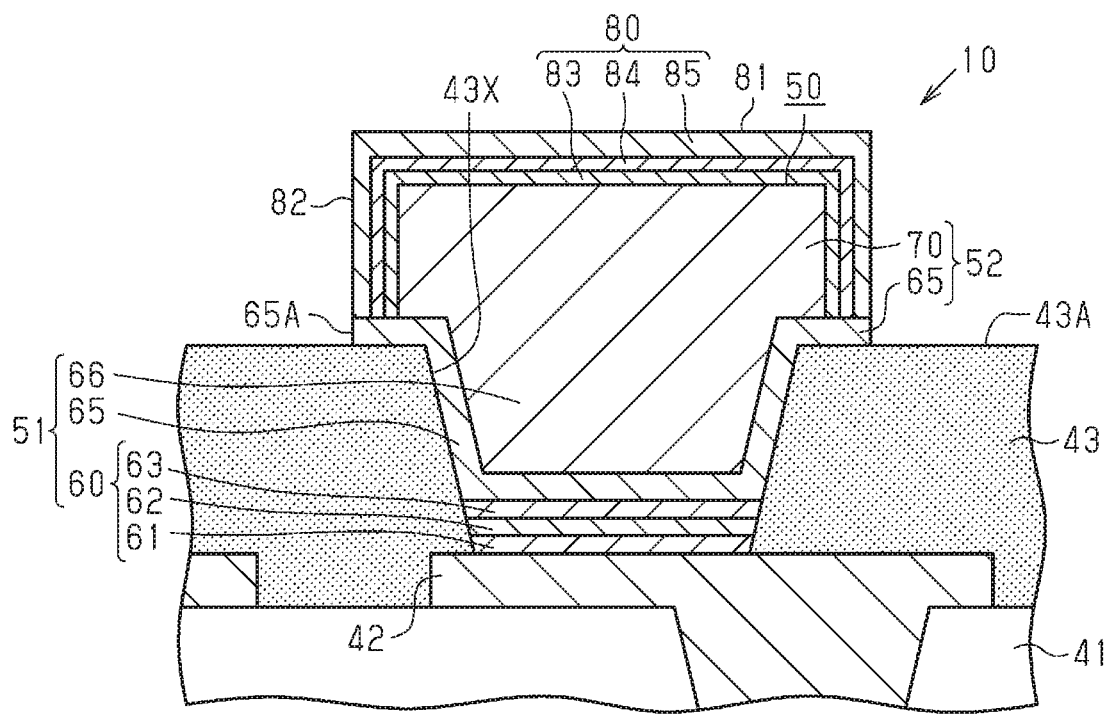
FIG. 1B is a partially enlarged cross-sectional view of the wiring substrate illustrated in FIG. 1A.

The structure of the wiring layer 50 and the outer coating plating layer 80 will now be described in detail with reference to FIG. 1B.

The wiring layer 50 includes a diffusion prevention layer 60 formed on the upper surface of the wiring layer 42 exposed in each opening 43X. In the present example, the lower portion of each opening 43X is filled with the diffusion prevention layer 60. The diffusion prevention layer 60 has the structure of a stack formed by using an Ni layer 61 as a bottom layer and stacking the Ni layer 61, a Pd layer 62, and an Au layer 63 in this order on the upper surface of the wiring layer 42 in each opening 43X. The diffusion prevention layer 60 may be an Au layer or an Ni layer/Au layer (metal layer in which Ni layer serves as bottom layer, with Ni layer and Au layer stacked in this order). The Ni layer 61, Pd layer 62, and Au layer 63 may each be, for example, an electroless plating metal layer formed by performing an electroless plating process. The Ni layer 61 is a metal layer formed from Ni or an Ni alloy, the Pd layer 62 is a metal layer formed from Pd or a Pd alloy, and the Au layer 63 is a metal layer formed from Au or an Au alloy.

The Ni layer 61 has, for example, a diffusion prevention function for preventing diffusion of Cu included in the wiring layer 42 and the like to the Pd layer 62 and the Au layer 63. The Pd layer 62 and the Au layer 63 are formed from metals (i.e., Pd and Au) that have higher resistance to oxidation than the metal forming the wiring layer 42 (in this example, Cu) and thereby have an oxidation prevention function.

The wiring layer 50 includes the seed layer 65 continuously covering the wall surface of each opening 43X and the upper surface 43A of the solder resist layer 43. In the example of FIG. 1B, the seed layer 65 continuously covers the upper surface of the diffusion prevention layer 60 (upper surface of Au layer 63 in present example), the wall surface of each opening 43X that is not covered by the diffusion prevention layer 60, and the upper surface 43A of the solder resist layer 43. The material of the seed layer 65 may be, for example, copper (Cu) or a copper alloy. The seed layer 65 may be, for example, an electroless plating metal layer (e.g., electroless copper plating layer) formed by performing an electroless plating process (e.g., electroless copper plating process).

The wiring layer 50 includes a metal layer 66 formed on the seed layer 65 in each opening 43X. The opening 43X is filled with the seed layer 65 and the metal layer 66 on the seed layer 65. The material of the metal layer 66 may be, for example, copper (Cu) or a copper alloy. The metal layer 66 may be, for example, an electrolytic copper plating layer formed by performing an electrolytic copper plating process.

In the present example, the via wiring 51 of the wiring layer 50 includes the diffusion prevention layer 60, the seed layer 65 in each opening 43X, and the metal layer 66.

The wiring layer 50 includes the metal posts 70 formed on the seed layer 65, which is located on the upper surface 43A of the solder resist layer 43, and on the via wiring 51 (upper surface of metal layer 66). Each metal post 70 is, for example, formed integrally with the metal layer 66. Although not clearly illustrated in FIG. 1B, the upper surface of the metal layer 66 may be, for example, flush with the upper surface of the seed layer 65. Each metal post 70 is, for example, cylindrical. The planar shape of each of the metal posts 70 is, for example, larger than the planar shape of the metal layer 66. Each metal post 70 has, for example, a larger diameter than the corresponding upper surface of the metal layer 66.

The material of the metal post 70 may be, for example, copper (Cu) or a copper alloy. The metal post 70 may be, for example, an electrolytic copper plating layer formed by performing an electrolytic copper plating process. The metal post 70 may have a height of, for example, 5 to 30 μm. The metal post 70 may have a diameter of, for example, 20 to 120 μm. The pitch of the metal posts 70 may be, for example, 30 to 200 μm.

The upper surface of the seed layer 65, which is located on the upper surface 43A of the solder resist layer 43, entirely covers the lower surface of each metal post 70, which projects outward from the metal layer 66. For example, an outer end surface 65A of the seed layer 65, which is located on the upper surface 43A of the solder resist layer 43, projects outward from the side surface of each metal post 70.

In the present example, the connection terminals 52 of the wiring layer 50 are formed by the metal posts 70 and the seed layer 65 that is located on the upper surface 43A of the solder resist layer 43.

The outer coating plating layer 80 entirely covers the upper surface and side surface of each metal post 70. In the present example, the outer coating plating layer 80 includes an upper portion 81, which entirely covers the upper surface of each metal post 70, and a side portion 82, which entirely covers a side surface of each metal post 70. The seed layer 65 includes an outer end surface 65A exposed from the side portion 82. The side portion 82 is thinner than the upper portion 81.

The upper portion 81 has the structure of a stack (in present example, three-layer structure) formed by stacking a plating layer 83, which serves as a bottom layer, a plating layer 84, and a plating layer 85 in this order on the upper surface of the metal post 70. The side portion 82 has the structure of a stack (in present example, three-layer structure) formed by stacking the plating layers 83, 84, and 85 in this order on the side surface of the metal post 70. Thus, in the outer coating plating layer 80 of the present example, the upper portion 81 and the side portion 82 each have a structure including a stack of the plating layers 83, 84, and 85. The plating layers 83, 84, and 85 are each formed by, for example, an electrolytic plating metal layer formed by performing an electrolytic plating process.

The plating layer 83 continuously covers the entire side surface and entire upper surface of each metal post 70. The plating layer 83 has, for example, a diffusion prevention function for preventing diffusion of the Cu included in the metal post 70 or the like to the plating layers 84 and 85. The thickness and material composition of the plating layer 83 is set taking into consideration characteristics such as the diffusion prevention effect, the corrosion resistance effect for preventing corrosion of the connection terminals 52 (metal posts 70), and the adhesion with the plating layer 84 and the seed layer 65. The material of the plating layer 83 may be, for example, a metal material including nickel (Ni), cobalt (Co), or silver (Ag). In the present example, the material of the plating layer 83 may be, for example, Ni or an Ni alloy.

The plating layer 84 covers the entire side surface and entire upper surface of the plating layer 83. The plating layer 84 has an oxidation prevention function for preventing oxidation of each metal post 70. The material of the plating layer 84 may be, for example, a metal that has higher resistance to oxidation than the metal (Cu) forming the metal posts 70. The material of the plating layer 84 may be, for example, Pd or a Pd alloy.

The plating layer 85 covers the entire side surface and entire upper surface of the plating layer 84. The plating layer 85 has an oxidation prevention function for preventing oxidation of each metal post 70. The material of the plating layer 85 may be, for example, a metal that has higher resistance to oxidation than the metal (Cu) forming the metal posts 70. The material of the plating layer 85 may be, for example, Au or an Au alloy.

The plating layers 83, 84, and 85 are formed so that the total thickness of the plating layers 83, 84, and 85 at the side portion 82 is less than the total thickness of the plating layers 83, 84, and 85 at the upper portion 81. In the present example, the thickness of the plating layer 83 is the same in the upper portion 81 and the side portion 82. The thickness of the plating layer 84 is the same in the upper portion 81 and the side portion 82. The plating layer 85 is thinner at the side portion 82 than the upper portion 81. The plating layer 83 may have a thickness of, for example, approximately 1 to 10 µm. The plating layer 84 may have a thickness of, for example, approximately 0.1 to 0.5 µm. The plating layer 85 of the side portion 82 may have a thickness of, for example, approximately 0.1 to 0.3 µm. The plating layer 85 of the upper portion 81 may have a thickness of, for example, approximately 0.3 to 0.5 µm.

The lower surface of the side portion 82 is spaced apart from the upper surface 43A of the solder resist layer 43. In the present example, the lower surface of the side portion 82 is spaced apart from the upper surface 43A of the solder resist layer 43 by an amount corresponding to the thickness of the seed layer 65. The lower surface of the side portion 82 is formed on the upper surface of the seed layer 65 in contact with the upper surface of the seed layer 65. In the present example, the outer surface of the side portion 82 (plating layer 85) is substantially flush with the outer end surface 65A of the seed layer 65, and the lower surface of the side portion 82 is entirely formed on the upper surface of the seed layer 65 in contact with the upper surface of the seed layer 65. Accordingly, the seed layer 65 entirely covers the lower surfaces of the plating layers 83, 84, and 85 in the side portion 82.

In the first embodiment, the outer coating plating layer 80 is formed by stacking the plating layer 83, which is a nickel (Ni) layer, the plating layer 84, which is a palladium (Pd) layer, and the plating layer 85, which is a gold (Au) layer, in this order on the surface of each metal post 70. Instead, the outer coating plating layer 80 may be formed by stacking, on the surface of each metal post 70, for example, an Ni layer and an Au layer in this order, an Ni layer, a Pd layer, and a silver (Ag) layer in this order, an Ni layer, a Pd layer, an Ag layer, and an Au layer in this order, or an Ag layer and an Au layer in this order. Alternatively, the outer coating plating layer 80 may have, for example, a single-layer structure of an Ag layer or an Au layer.

Figure 2:
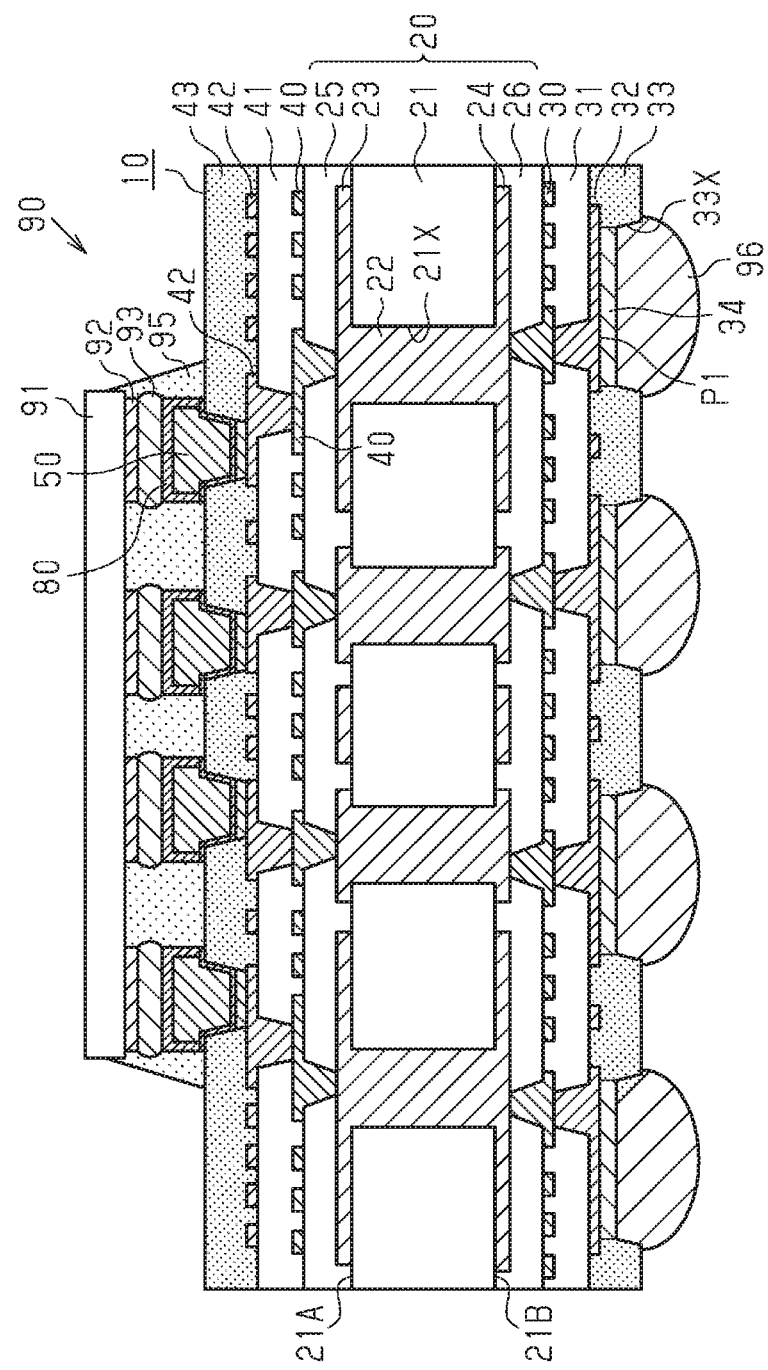
FIG. 2 is a schematic cross-sectional view of a semiconductor device including the wiring substrate illustrated in FIG. 1A.

The structure of a semiconductor device 90 the wiring layer 50 will now be described with reference to FIG. 2.

The semiconductor device 90 includes the wiring substrate 10, one or more (one in FIG. 2) semiconductor elements 91, underfill material 95, and external connection terminals 96.

The semiconductor element 91 is flip-chip-mounted on the wiring substrate 10. In the present example, the connection terminals 92 arranged on the circuit formation surface (lower surface in FIG. 2) of the semiconductor element 91 are bonded by the solder layer 93 with the outer coating plating layer 80 of the wiring substrate 10 to electrically connect the semiconductor element 91 to the wiring layer 50 via the connection terminals 92, the solder layer 93, and the outer coating plating layer 80.

The semiconductor element 91 may be, for example, a logic chip such as a central processing unit (CPU) chip or a graphics processing unit (GPU) chip. Further, the semiconductor element 91 may be, for example, a memory chip such as a dynamic random access memory (DRAM) chip or a static random access memory (SRAM) chip. Additionally, logic chips and memory chips may be combined to mount a plurality of semiconductor elements 91 on the wiring substrate 10.

The connection terminals 92 may each be, for example, a metal post. The connection terminals 92 are post-shaped connection terminals extending downward from the circuit formation surface of the semiconductor element 91. In the present example, the connection terminals 92 are cylindrical. The material of the connection terminals 92 may be, for example, copper (Cu) or a copper alloy. In addition to metal posts, the connection terminals 92 may be, for example, metal bumps such as gold bumps.

The solder layer 93 may be, for example, solder plating such as lead-free solder. The solder plating may be, for example, an Sn—Ag, Sn—Cu, Sn—Ag—Cu, or Sn-Bu lead-free solder.

The gap between the wiring substrate 10 and the semiconductor element 91 is filled with the underfill material 95. The material of the underfill material 95 may be, for example, an insulative resin such as an epoxy resin.

The external connection terminals 96 are formed on the diffusion prevention layer 34, which is arranged on the external connection pads P1 of the wiring substrate 10. The external connection terminals 96 are, for example, electrically connected to pads arranged on a mounting substrate such as a motherboard (not illustrated). The external connection terminals 96 may be, for example, solder balls or lead pins. In the first embodiment, solder balls are used as the external connection terminals 96.

A method for manufacturing the wiring substrate 10 will now be described. To simplify illustration, portions that will form elements of the wiring substrate 10 are given the same reference characters as the corresponding elements in the final wiring substrate 10.

Figure 3A:
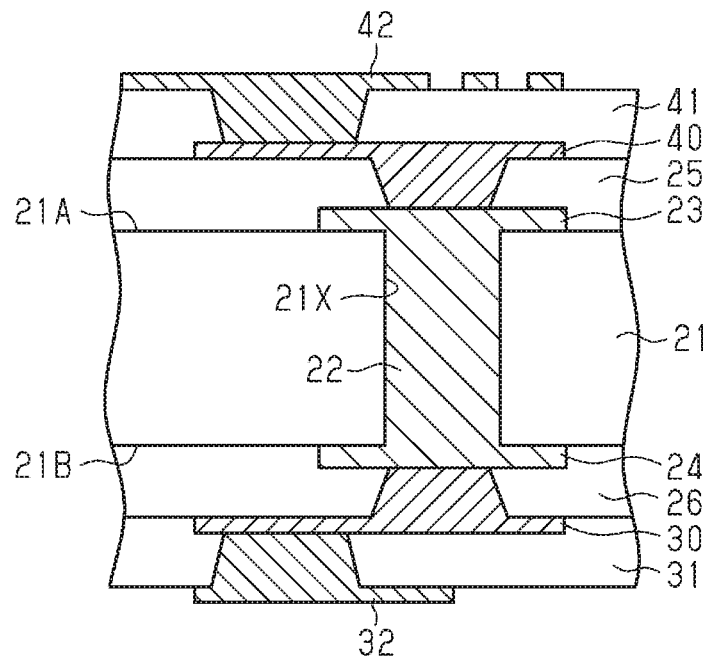
FIGS. 3A, 3B, 4A, 4B, 5A, 5B, 6A, 6B, 7A, and 7B are schematic cross-sectional views illustrating a method for manufacturing the wiring substrate illustrated in FIG. 1A.

With reference to FIG. 3A, the wiring substrate 10 is prepared in a stage prior to the formation of the solder resist layer 43, the wiring layer 50, and the outer coating plating layer 80, which are illustrated in FIG. 1A. The wiring substrate 10 may be manufactured through a known method. The method will now be briefly described with reference to FIG. 3A.

First, the through holes 21X are formed at given locations in the core substrate 21. Each through hole 21X is filled with plating to form the through electrode 22. Then, for example, a subtractive process is performed to form the wiring patterns 23 and 24. The wiring patterns 23 and 24 are connected to the through electrode 22. A resin film is vacuum-laminated on each of the upper surface 21A and lower surface 21B of the core substrate 21. The resin film is then heated and hardened to form insulation layers 25 and 26. The insulation layers 25 and 26 may be formed by applying and heating a paste or liquid of resin. Through holes are formed in each of the insulation layers 25 and 26, and a desmear process is performed when necessary. Then, for example, a semi-additive process is performed to form the wiring layers 30 and 40 on the insulation layers 25 and 26, respectively. In the same manner as the insulation layers 25 and 26, the insulation layer 41 is formed on the upper surface of the insulation layer 25, and the insulation layer 31 is formed on the lower surface of the insulation layer 26. Through holes are formed in each of the insulation layers 31 and 41, and a desmear process is performed when necessary. Then, for example, a semi-additive process is performed to form the wiring layers 32 and 42.

Figure 3B:
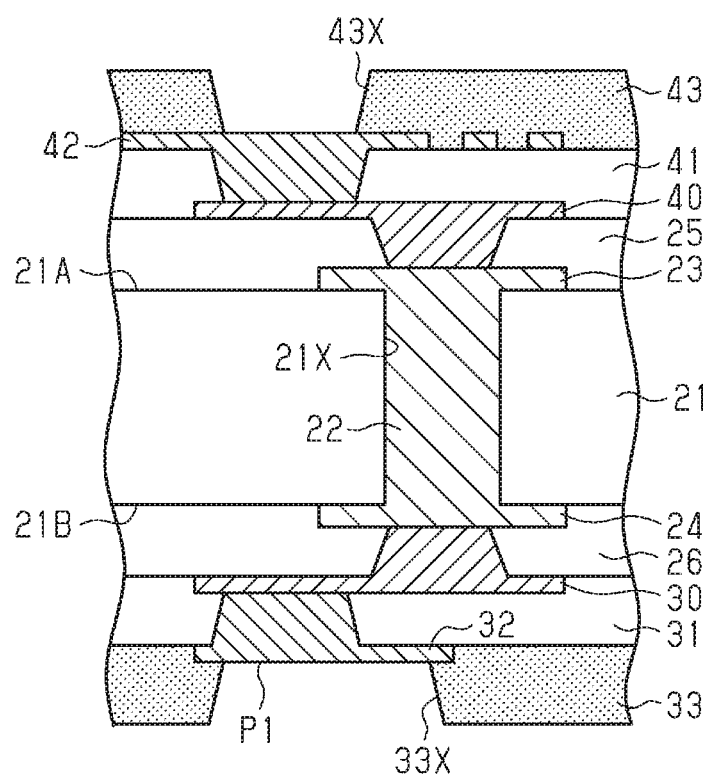

In the step illustrated in FIG. 3B, a solder resist layer 33 is formed on the lower surface of the insulation layer 31. The solder resist layer 33 includes the opening 33X partially exposing the lower surface of the wiring layer 32 as the external connection pad P1. The solder resist layer 33 may be formed by, for example, laminating a photosensitive solder resist film to the lower surface of the insulation layer 31 or applying a liquid of solder resist to the lower surface of the insulation layer 31 and patterning the resist by performing a photolithography process. The solder resist layer 43 is formed on the upper surface of the insulation layer 41. The solder resist layer 43 includes the opening 43X partially exposing the upper surface of the wiring layer 42. The solder resist layer 43 may be formed in a process similar to that of the solder resist layer 33.

Figure 4A:
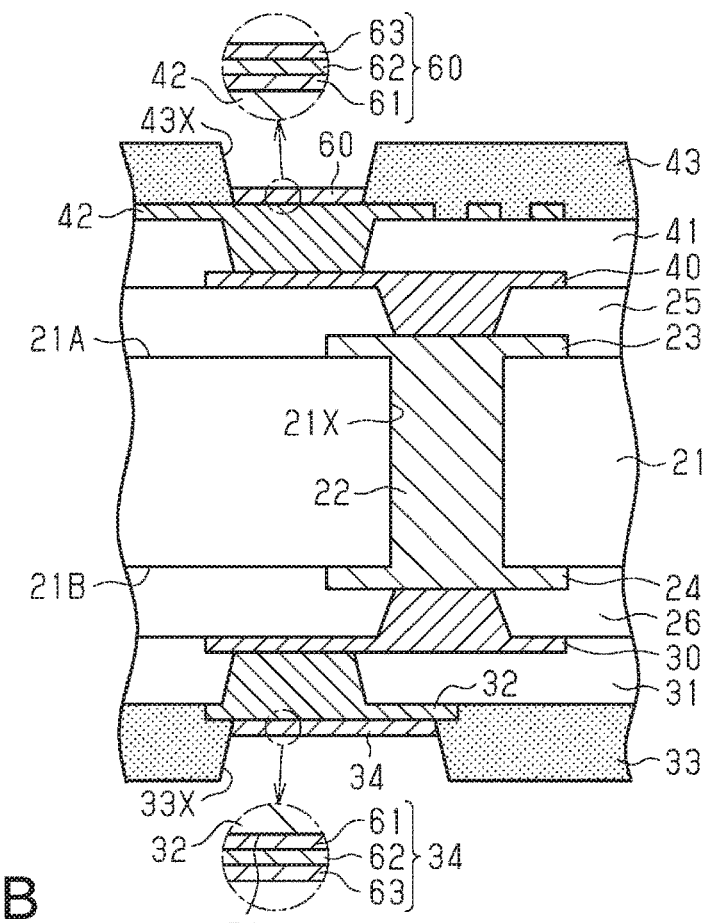

In the step illustrated in FIG. 4A, the diffusion prevention layer 60 is formed on the upper surface of the wiring layer 42 exposed in the opening 43X of the solder resist layer 43. In the same manner, the diffusion prevention layer 34 is formed on the lower surface of the wiring layer 32 (i.e., external connection pad P1) exposed in the opening 33X of the solder resist layer 33. The diffusion prevention layer 60 has the structure of a stack formed by using the Ni layer 61 as a bottom layer and stacking the Ni layer 61, the Pd layer 62, and the Au layer 63 in this order on the upper surface of the wiring layer 42. In the same manner, the diffusion prevention layer 34 has the structure of a stack formed by stacking the Ni layer 61, the Pd layer 62, and the Au layer 63 in this order on the external connection pad P1. The diffusion prevention layers 34 and 60 are formed by, for example, performing an electroless plating process.

The Ni layer 61 may be formed by performing an electroless plating process using, for example, a plating liquid obtained by mixing nickel sulfate, carboxylate, sodium hypophosphite, and a sulfur compound. The Pd layer 62 may be formed by performing an electroless plating process using, for example, a plating liquid obtained by mixing tetrammine di chloro palladium, aminocarboxylic acid, an amine compound, sodium hypophosphite, and an inorganic chloride. The Au layer 63 may be formed by performing an electroless plating process using, for example, a plating liquid obtained by mixing potassium dicyanoaurate, potassium cyanide, aminocarboxylate, an amine compound, phosphate, sulfonate, and formaldehyde.

Figure 4B:
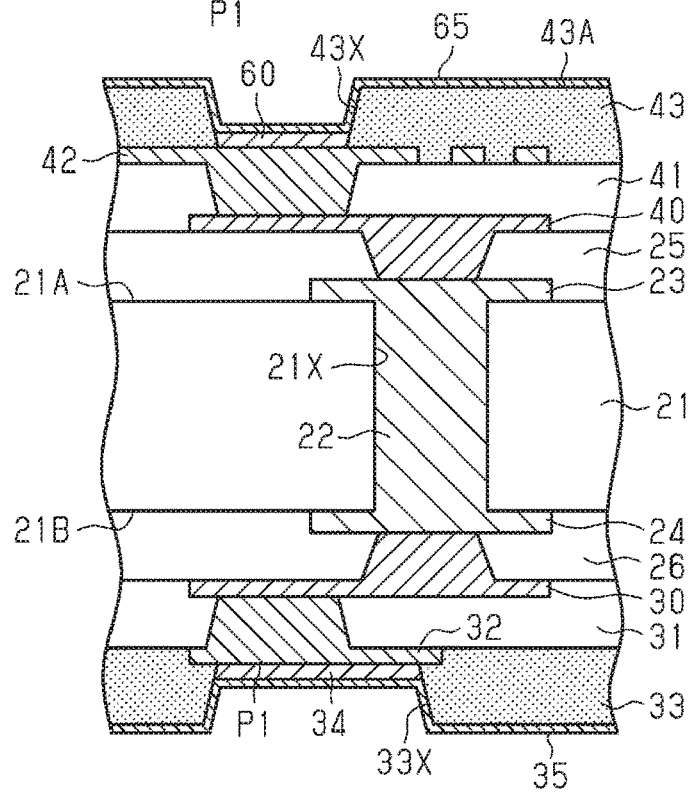

In the step illustrated in FIG. 4B, the seed layers 35 and 65 are formed. The seed layer 65 continuously covers the entire upper surface of the diffusion prevention layer 60, the entire wall surface of the opening 43X that is not covered by the diffusion prevention layer 60, and the entire upper surface 43A of the solder resist layer 43. The seed layer 35 continuously covers the entire lower surface of the diffusion prevention layer 34, the entire wall surface of the opening 33X that is not covered by the diffusion prevention layer 34, and the entire lower surface of the solder resist layer 33. The seed layers 35 and 65 may be formed by performing an electroless copper plating process using, for example, a plating liquid obtained by mixing copper sulfate, sodium hydroxide, carboxylate, nickel sulfate, and formaldehyde.

Figure 5A:
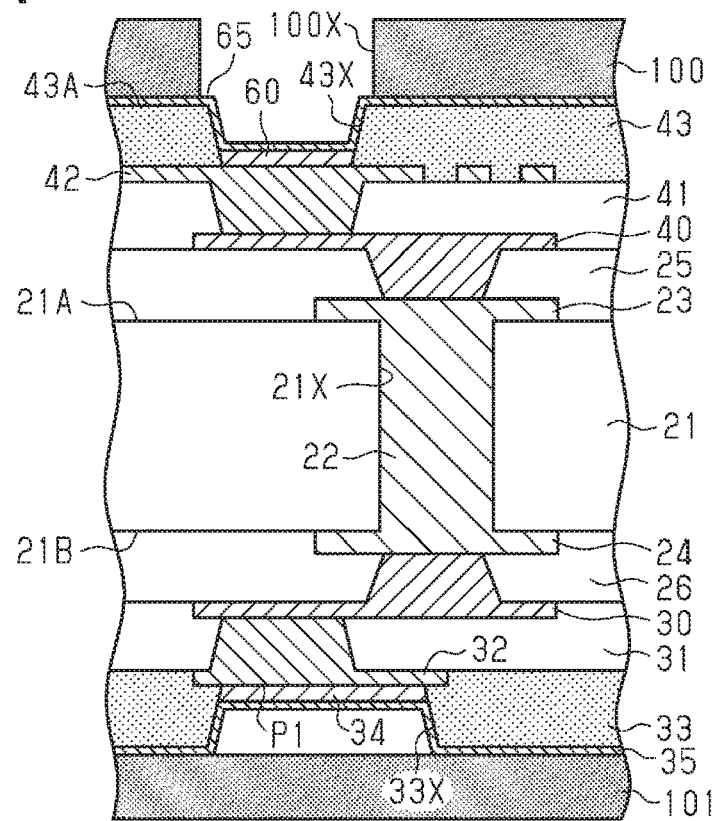

In the step illustrated in FIG. 5A, a resist layer 100 is formed on the seed layer 65, which is located on the upper surface 43A of the solder resist layer 43. The resist layer 100 includes opening patterns 100X at given locations. The opening patterns 100X expose portions of the seed layer 65 corresponding to the regions where the connection terminals 52 (refer to FIGS. 1A and 1B) are formed. The material of the resist layer 100 may be, for example, a material that resists plating in the plating process performed in the following step. For example, a photosensitive dry film resist or a liquid photoresist may be used as the resist layer 100. Examples of such a resist material include a novolak resin, an acrylic resin, and the like. For example, when using a photosensitive dry film resist, thermal compression bonding is performed to laminate a dry film onto the upper surface of the seed layer 65, and a photolithography process is performed to pattern the dry film and form the resist layer 100 including the opening patterns 100X. When using a liquid photoresist, the same process may be performed to form the resist layer 100.

A resist layer 101 is formed on the seed layer 35, which is located on the lower surface of the solder resist layer 33. The resist layer 101 entirely covers the lower surface of the seed layer 35. The material of the resist layer 101 may be the same as the material of the resist layer 100. For example, thermal compression bonding is performed to laminate a dry film onto the lower surface of the seed layer 35.

Figure 5B:
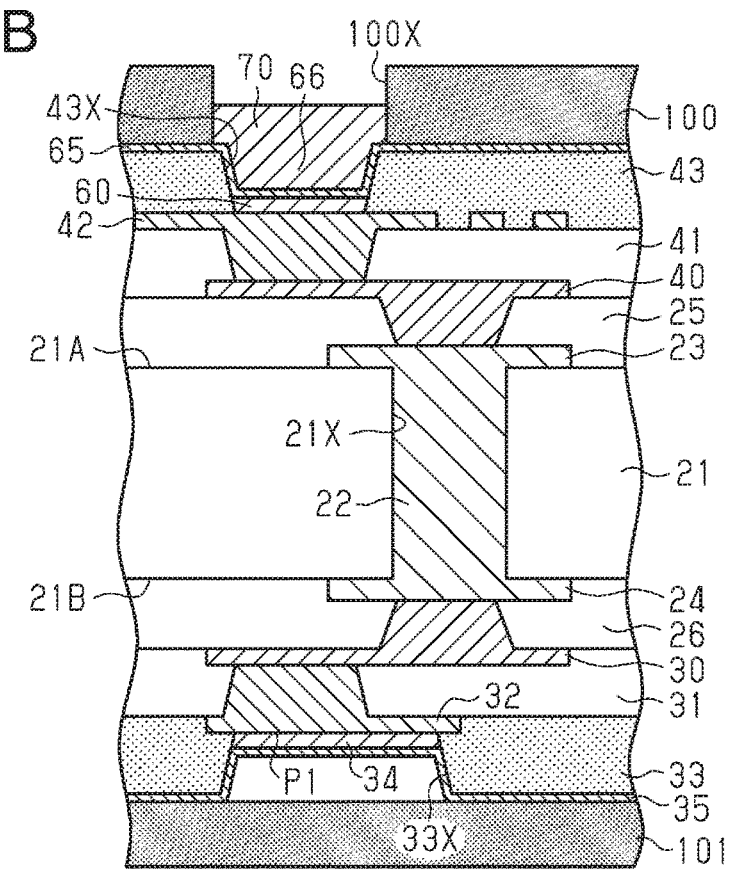

In the step illustrated in FIG. 5B, electrolytic plating (in present example, electrolytic copper plating) is performed using the resist layer 100 as a plating mask and the seed layer 65 as a power supplying layer to form the metal layer 66 and the metal post 70 on the seed layer 65 exposed in the opening pattern 100X. In the present example, the metal layer 66 and the metal post 70 are formed integrally. In the electrolytic copper plating process, the plating liquid may be a solution obtained by dissolving copper sulfate in sulfuric acid.

Figure 6A:
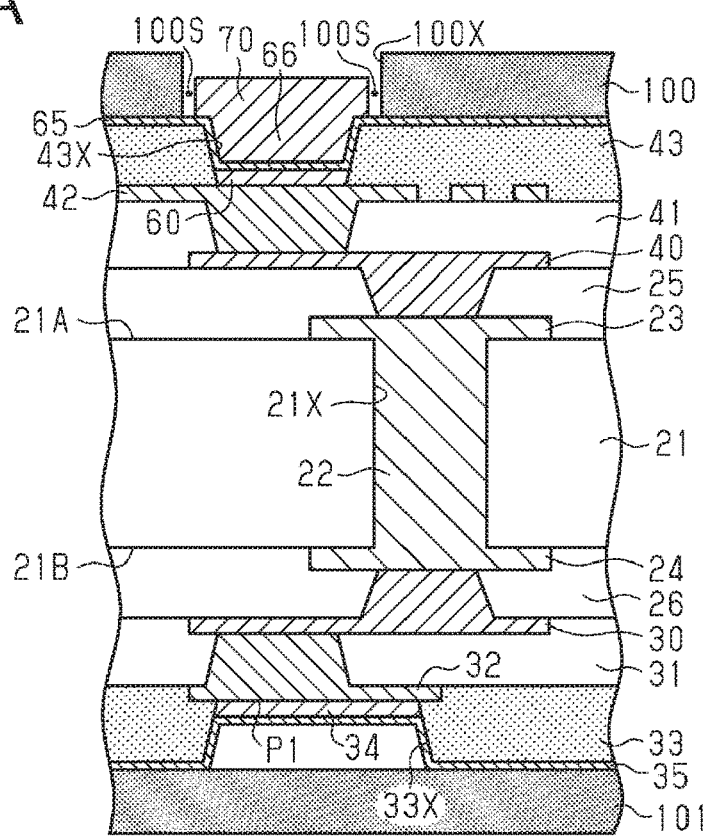

In the step illustrated in FIG. 6A, the portion of the resist layer 100 in the vicinity of the upper surface of the resist layer 100 and wall surface of the opening pattern 100X is etched to form a gap 100S between the side surface of the metal post 70 and the wall surface of the opening pattern 100X. In the etching step, the metal post 70 (in present example, Cu layer) and the seed layer 65 (in present example, Cu layer) are not etched. The resist layer 100 is selectively etched to reduce the thickness of the resist layer 100. The gap 100S obtained as a result of the selective etching exposes the upper surface of the seed layer 65 between the side surface of the metal post 70 and the wall surface of the opening pattern 100X. In such an etching step, for example, dry etching (plasma etching) may be performed using an etching gas such as carbon tetrafluoride ($CF_4$). Plasma etching easily permeates gaps. Thus, the use of plasma etching allows for the gap 100S to be formed extending to the lower portion of the metal post 70 with a small etching amount. In plasma etching, the metal post 70 and the seed layer 65 each function as an etching stopper layer. In the first embodiment, etching is performed so that the upper surface of the resist layer 100 is located upward from the upper surface of the metal post 70.

Figure 6B:
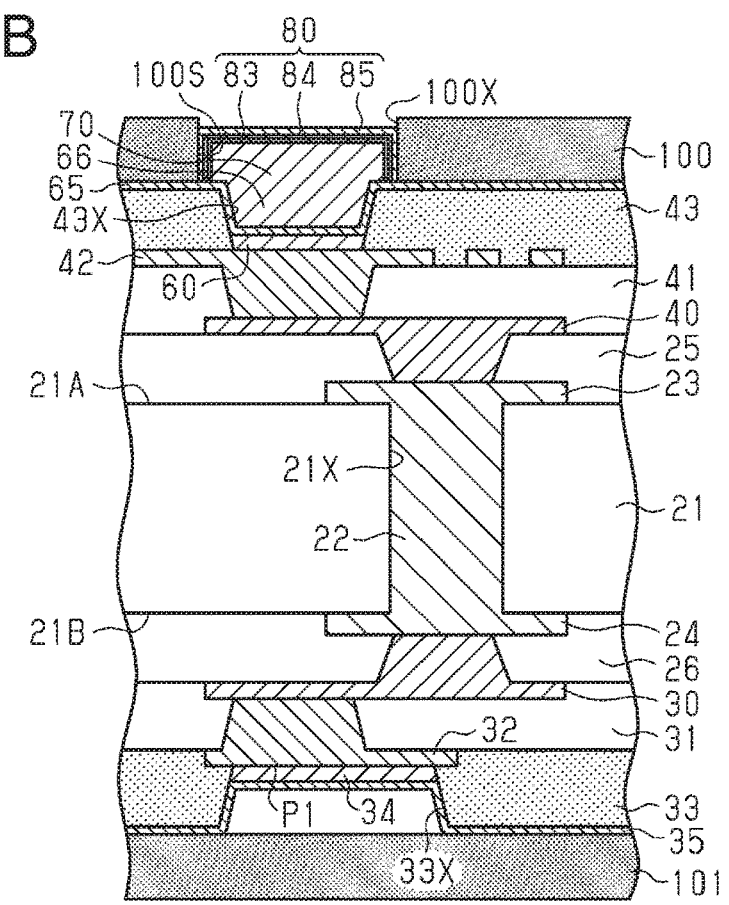

In the step illustrated in FIG. 6B, the outer coating plating layer 80 is formed covering the entire upper surface of the metal post 70 and the entire side surface of the metal post 70. The outer coating plating layer 80 is formed by stacking the plating layers 83, 84, and 85 in this order on the side surface and upper surface of the metal post 70. The gap 100S is filled with the outer coating plating layer 80. The outer coating plating layer 80 (plating layers 83 to 85) is formed by, for example, performing an electrolytic plating process using the seed layer 65 as a power supplying layer. In the electrolytic plating process, a plating film is deposited on the upper surface and side surface of the metal post 70 and the upper surface of the seed layer 65 exposed from the gap 100S. The plating film is formed by the electrolytic plating process and thereby not deposited on the resist layer 100.

The plating layer 83 (Ni layer) may be formed by performing an electrolytic Ni plating process using, for example, a plating liquid obtained by mixing nickel sulfate, boric acid, and nickel chloride. In the first embodiment, the plating layer 83 continuously covers the entire side surface and entire upper surface of the metal post 70. In the present example, the thickness of the plating layer 83 is the same on the side surface and upper surface of the metal post 70.

The plating layer 84 (Pd layer) is formed by performing, for example, an electrolytic Pd plating process using a plating liquid obtained by mixing tetrammine di chloro palladium, ammonium dihydrogen phosphate, and the like. In the first embodiment, the plating layer 84 continuously covers the entire side surface and entire upper surface of the metal post 70. In the present example, the thickness of the plating layer 84 is the same on the side surface and upper surface of the plating layer 83.

The plating layer 85 (Au layer) is formed by performing, for example, an electrolytic Au plating process using a plating liquid obtained by mixing potassium gold cyanide, thallium acetate, and the like. In the first embodiment, the plating layer 85 continuously covers the entire side surface and entire upper surface of the plating layer 84. In the present example, the gap 100S is filled with the plating layers 83, 84, and 85. After filling the gap 100S with the plating layers 83, 84, and 85, the plating layer 85 covering the side surface of the plating layer 84 is not further increased in thickness. In the present example, after filling the gap 100S with the plating layers 83, 84, and 85, deposition of the plating film on the plating layer 84 is continued in the electrolytic Au plating process. Thus, the plating layer 85 covering the upper surface of the plating layer 84 becomes thicker than the plating layer 85 covering the side surface of the plating layer 84. Consequently, the outer coating plating layer 80 is thinner at the side portion 82 than the upper portion 81.

Figure 7A:
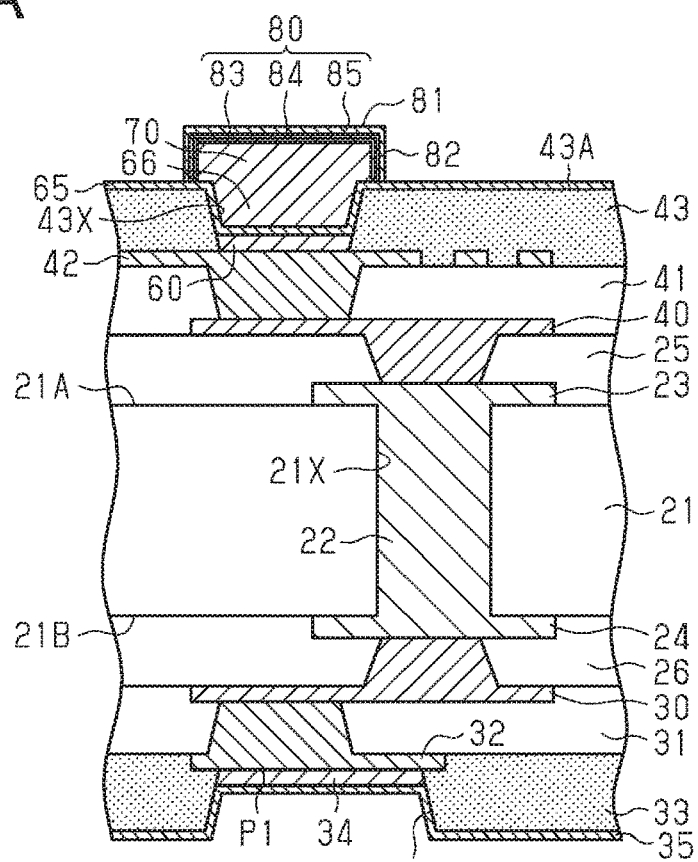

In the step illustrated in FIG. 7A, the resist layers 100 and 101 illustrated in FIG. 6B are removed by an alkali delamination liquid (e.g., organic amine delamination liquid, caustic soda, acetone, or ethanol). Thus, the side portion 82 of the outer coating plating layer 80 is exposed to the outside, and the seed layers 35 and 65 are exposed to the outside.

Figure 7B:
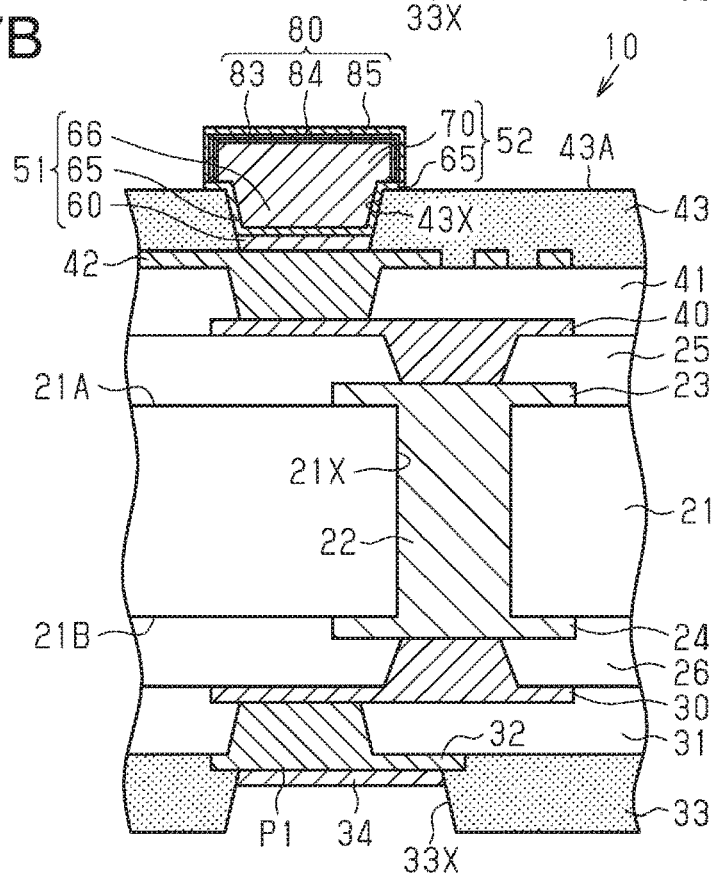

In the step illustrated in FIG. 7B, etching is performed using the outer coating plating layer 80 as an etching mask to remove the unnecessary seed layers 35 and 65. When the seed layers 35 and 65 are electroless copper plating layers, the unnecessary seed layers 35 and 65 are removed by performing, for example, wet etching with a sulfuric acid peroxide etching liquid. Thus, the seed layer 65 remains only below the metal post 70. The etching step forms the via wiring 51 from the diffusion prevention layer 60 and the seed layer 65 in the opening 43X of the solder resist layer 43. Further, the connection terminal 52 is formed by the metal post 70 and the seed layer 65, which is located on the upper surface 43A of the solder resist layer 43. Additionally, the lower surface of the diffusion prevention layer 34 is exposed to the outside, and the lower surface of the solder resist layer 33 is exposed to the outside.

In the etching step of FIG. 7B, the outer coating plating layer 80 covers the entire side surface and entire upper surface of each metal post 70. Thus, when the outermost plating layer 85 (Au layer) of the outer coating plating layer 80 is exposed to the etching liquid, the metal post 70 is not exposed to the etching liquid. This reduces galvanic corrosion between the metal post 70 and the outer coating plating layer 80. After the seed layer 35 is removed, the diffusion prevention layer 34 is exposed to the outside, and the wiring layer 32 (Cu layer) is not exposed to the outside. Thus, the outermost (lowermost in this case) Au layer 63 (refer to FIG. 4A) of the diffusion prevention layer 34 is exposed to the etching liquid. Accordingly, after the seed layer 35 (refer to FIG. 7A) is removed, the Au layer 63, which is formed from the same type of metal as the plating layer 85, is exposed to the etching liquid, and the wiring layer 32 is not exposed to the etching liquid. This reduces galvanic corrosion between the wiring layer 32 and the diffusion prevention layer 34 (Au layer 63). The wiring substrate 10 illustrated in FIG. 1A is manufactured through the manufacturing process described above.

The first embodiment has the advantages described below.

(1) The outer coating plating layer 80 entirely covers the side surface and upper surface of each metal post 70, which is formed by an electrolytic copper plating layer. Thus, the surface of the metal post 70 is not exposed to the outside, and oxidation of the surface of the metal post 70 is limited in a preferred manner. As a result, increases are limited in the resistance of metal posts that would be caused by oxidation. This improves the reliability of the electrical connection between the connection terminals 92 of the semiconductor element 91 and the metal post 70 of the wiring substrate 10.

For example, in the reference example illustrated in FIG. 23, the side surface of the metal post 70 is exposed to the outside. In such a configuration, oxidation of the side surface of the metal post 70 will decrease the adhesion between the metal post 70 and the underfill material (e.g., underfill material 95 formed in the same manner as in FIG. 2). This will decrease the reliability of the connection between the connection terminal 92 of the semiconductor element 91 and the metal post 70 of the wiring substrate 220. In contrast, in the first embodiment (refer to FIGS. 1B and 2), the outer coating plating layer 80 is formed on the entire surface of the metal post 70 thereby reducing oxidation of the metal post 70. Thus, decreases are limited in the adhesion between the metal post 70 (outer coating plating layer 80) and the underfill material 95. This improves the reliability of the connection between the connection terminal 92 of the semiconductor element 91 and the metal post 70 of the wiring substrate 10.

(2) The outer coating plating layer 80 covers the entire side surface and entire upper surface of each metal post 70. Thus, when performing wet etching to remove the seed layer 65 (refer to FIG. 7B), exposure of the metal post 70 to etching liquid, to which the outer coating plating layer 80 is exposed, is limited. This reduces galvanic corrosion between the metal post 70 and the outer coating plating layer 80. Accordingly, over-etching of the metal post 70 that would be caused by galvanic corrosion is reduced in a preferred manner. This improves the reliability of the connection between the connection terminal 92 of the semiconductor element 91 and the metal post 70 of the wiring substrate 10.

(3) The outer coating plating layer 80 is formed so that the side portion 82 is thinner than the upper portion 81. Thus, even when the pitch is narrowed between the metal posts 70, short-circuiting of adjacent metal posts 70 (outer coating plating layer 80) is limited. While reducing the thickness of the side portion 82, the thickness of the upper portion 81, which is bonded to the solder layer 93, is increased. This improves the reliability of the connection between the solder layer 93 and the metal post 70 (outer coating plating layer 80). Consequently, the connection reliability is improved between the connection terminal 92 of the semiconductor element 91 and the metal post 70 of the wiring substrate 10.

(4) The diffusion prevention layer 34 is formed on the external connection pad P1 of the lowermost wiring layer 32 located on the opposite side of the uppermost wiring layer 50. The diffusion prevention layer 34 covers the entire lower surface of the wiring layer 32 exposed in the opening 33X of the solder resist layer 33. Thus, when performing wet etching to remove the seed layer 35 (refer to FIG. 7B), exposure of the wiring layer 32 to etching liquid, to which the diffusion prevention layer 34 is exposed, is limited. This reduces galvanic corrosion between the wiring layer 32 and the diffusion prevention layer 34.

Second Embodiment

A wiring substrate 10 in accordance with a second embodiment will now be described with reference to FIGS. 8 to 10B. The wiring substrate 10 of the second embodiment includes an outer coating plating layer 80A instead of the outer coating plating layer 80 of the first embodiment. The description hereafter will focus on differences from the first embodiment. Same reference numerals are given to those components that are the same as the corresponding components illustrated in FIGS. 1A to 7B. Such components will not be described in detail.

Figure 8:
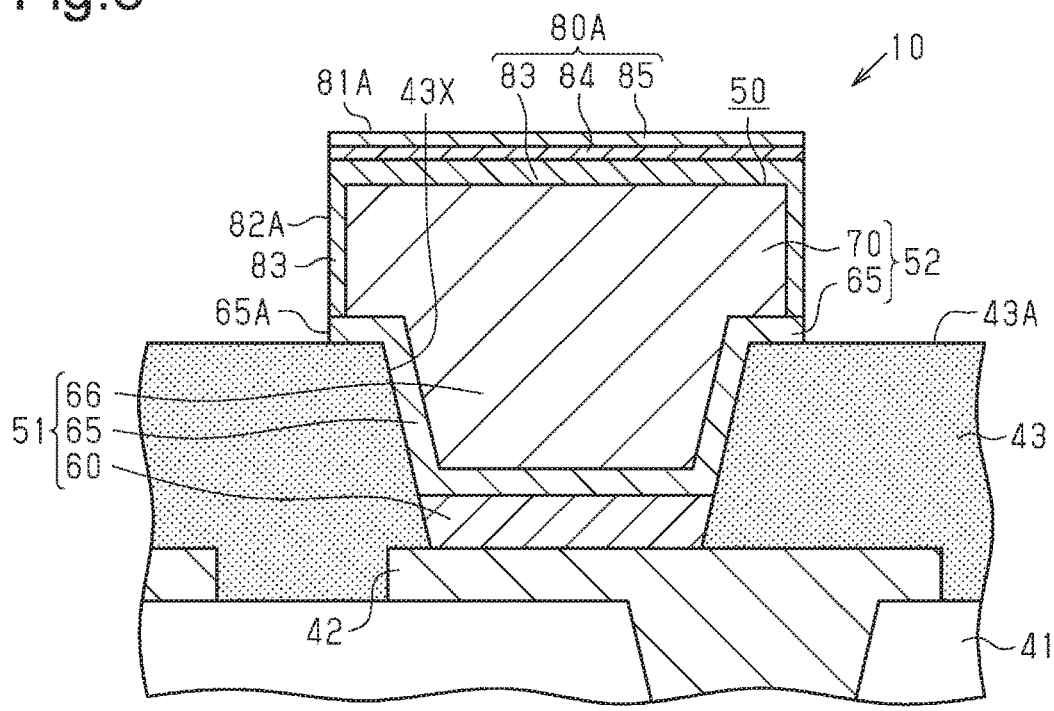
FIG. 8 is an enlarged cross-sectional view of a wiring substrate in accordance with a second embodiment.

Referring to FIG. 8, the outer coating plating layer 80A entirely covers the upper surface and side surface of each metal post 70. In the present example, the outer coating plating layer 80A includes an upper portion 81A, which entirely covers the upper surface of each metal post 70, and a side portion 82A, which entirely covers a side surface of each metal post 70. The seed layer 65 includes the outer end surface 65A exposed from the side portion 82A. The side portion 82A is thinner than the upper portion 81A.

The upper portion 81A and the side portion 82A have different layer structures. In the present example, the side portion 82A has a single-layer structure including only the plating layer 83 that entirely covers a side surface of each metal post 70. The upper portion 81A has the structure of a stack (in present example, three-layer structure) formed by using the plating layer 83 as a bottom layer and stacking the plating layers 83, 84, and 85 in this order on the upper surface of the metal post 70.

The plating layer 83 continuously covers the entire side surface and entire upper surface of each metal post 70. The plating layer 83 is thinner at the side portion 82A than the upper portion 81A. The plating layer 83 of the side portion 82A may have a thickness of, for example, approximately 1 to 4 μm. The plating layer 83 of the upper portion 81 may have a thickness of, for example, approximately 2 to 6 μm.

The plating layer 84 covers the entire upper surface of the plating layer 83 and exposes the entire side surface of the plating layer 83. The side surface of the plating layer 84 is, for example, flush with the side surface of the plating layer 83. The plating layer 84 may have a thickness of, for example, approximately 0.1 to 0.5 μm.

The plating layer 85 covers the entire upper surface of the plating layer 84. The plating layer 85 exposes the entire side surface of each of the plating layers 83 and 84. The side surface of the plating layer 85 is, for example, flush with the side surfaces of the plating layers 83 and 84. The plating layer 85 may have a thickness of, for example, approximately 0.1 to 0.3 μm.

The lower surface of the side portion 82A is formed on the upper surface of the seed layer 65 in contact with the upper surface of the seed layer 65. In the present example, the entire lower surface of the side portion 82A is in contact with the upper surface of the seed layer 65.

A method for manufacturing the wiring substrate 10 in accordance with the second embodiment will now be described. To simplify illustration, portions that will form elements of the wiring substrate 10 are given the same reference characters as the corresponding elements in the final wiring substrate 10.

Figure 9:
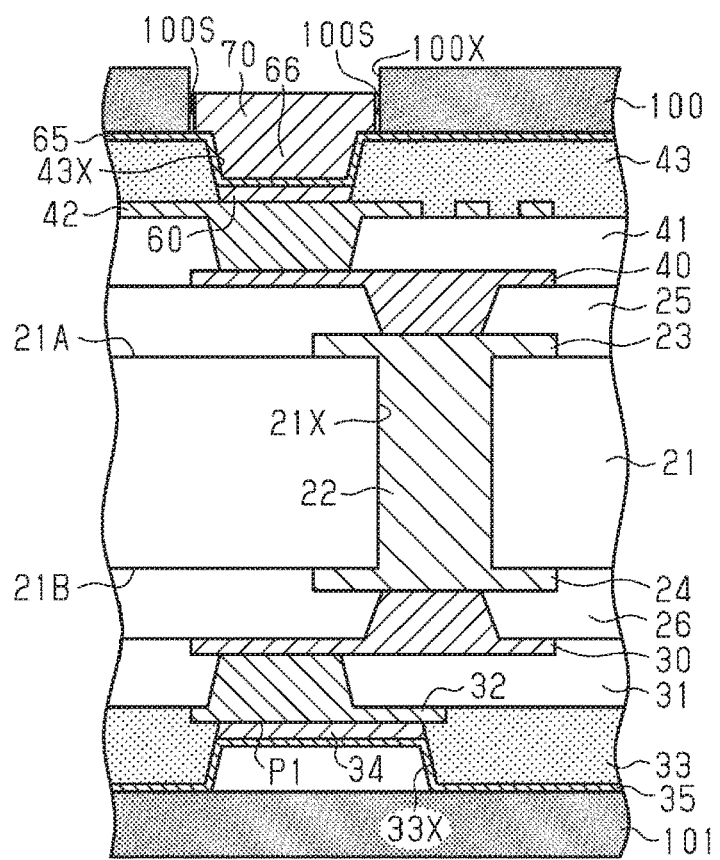
FIGS. 9, 10A, and 10B are schematic cross-sectional views illustrating a method for manufacturing the wiring substrate illustrated in FIG. 8.

The steps illustrated in FIGS. 3A to 6A are performed to obtain the structure illustrated in FIG. 9. In the structure illustrated in FIG. 9, the gap 100S is formed between the wall surface of the opening pattern 100X in the resist layer 100 and the side surface of the metal post 70. The size of the gap 100S is set in accordance with the thickness of the plating layer 83 that is formed in a subsequent step.

Figure 10A:
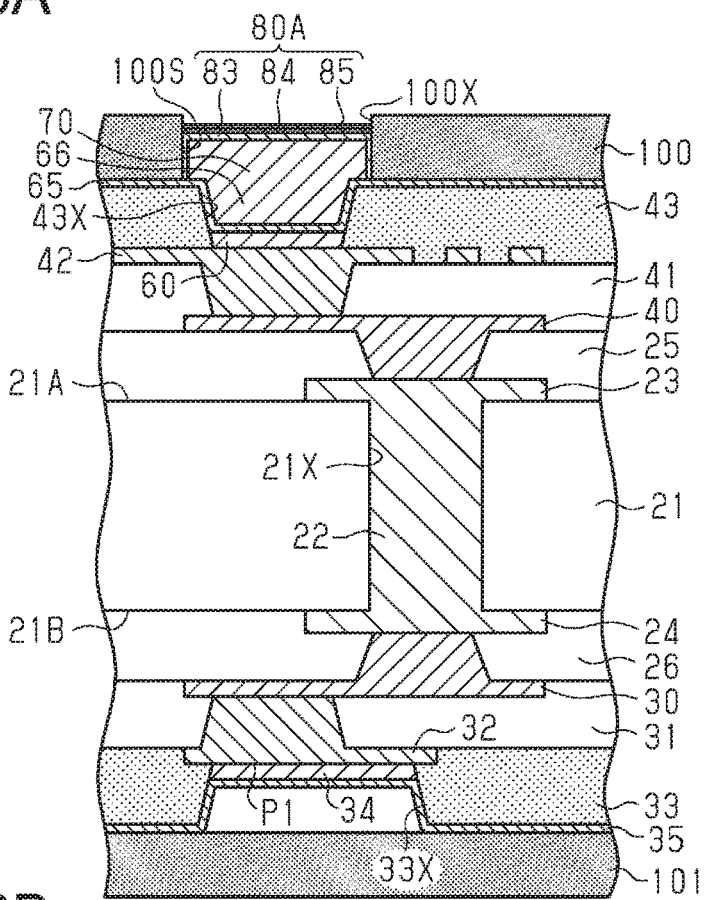

In the step illustrated in FIG. 10A, the outer coating plating layer 80A is formed covering the entire upper surface of the metal post 70 and the entire side surface of the metal post 70, which is exposed to the outside from the gap 100S. An electrolytic plating process (in present example, electrolytic Ni plating process) is performed to form the plating layer 83 that continuously covers the entire side surface and entire upper surface of the metal post 70. The gap 100S is filled with the plating layer 83. After filling the gap 100S with the plating layer 83, the plating layer 83 covering the side surface of the metal post 70 is not further increased in thickness. In the present example, after filling the gap 100S with the plating layer 83, deposition of a plating film on the upper surface of the metal post 70 is continued in the electrolytic Ni plating process. Thus, the plating layer 83 covering the upper surface of the metal post 70 becomes thicker than the plating layer 85 covering the side surface of the metal post 70. An electrolytic plating process (in present example, electrolytic Pd plating process) is performed to form the plating layer 84 that continuously covers the entire upper surface of the plating layer 83. Then, an electrolytic plating process (in present example, electrolytic Au plating process) is performed to form the plating layer 85 that continuously covers the entire upper surface of the plating layer 84. The gap 100S is filled with the plating layer 83. Thus, the plating layers 84 and 85 are formed only on the upper surface of the plating layer 83.

Figure 10B:
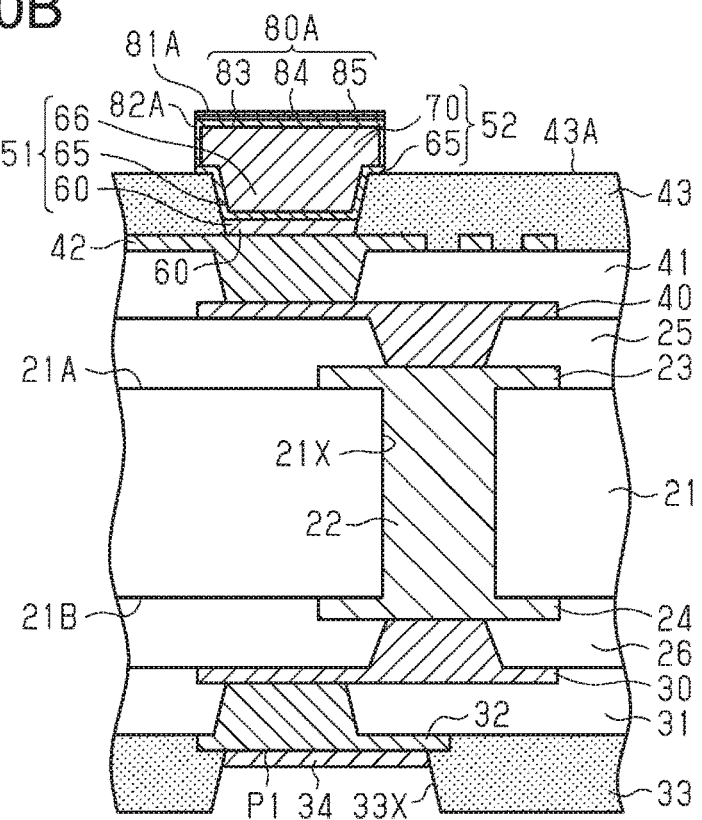

In the step illustrated in FIG. 10B, the resist layers 100 and 101 illustrated in FIG. 10A are removed by an alkali delamination liquid in the same manner as in FIG. 7A. Then, in the same manner as the step illustrated in FIG. 7B, wet etching is performed using the outer coating plating layer 80A as an etching mask to remove the unnecessary seed layers 35 and 65. The wiring substrate 10 in accordance with the second embodiment illustrated in FIG. 8 is manufactured through the manufacturing process described above.

In addition to advantage (1) to (4) of the first embodiment, the second embodiment has the advantages described below.

(5) The upper portion 81A and the side portion 82A of the outer coating plating layer 80A have different layer structures. Thus, the layer structures of the upper portion 81A and the side portion 82A may each be set in accordance with the characteristics required for the upper portion 81A and the characteristics required for the side portion 82A.

(6) The plating layer 85 is an Au layer that easily allows for the formation of an alloy layer with the solder layer 93. The plating layer 85 is formed on only the upper surface of the metal post 70. This limits the solder layer 93 that moves toward the side surface of the metal post 70. Thus, even when the pitch is narrowed between the metal posts 70, short-circuiting of adjacent metal posts 70 (outer coating plating layer 80A) that would be caused by the solder layer 93 is limited.

Third Embodiment

A wiring substrate 10 in accordance with a third embodiment will now be described with reference to FIGS. 11 to 14. The wiring substrate 10 of the third embodiment includes an outer coating plating layer 80B instead of the outer coating plating layers 80 and 80A of the first and second embodiments. The description hereafter will focus on differences from the second embodiment. Same reference numerals are given to those components that are the same as the corresponding components illustrated in FIGS. 1A to 10B. Such components will not be described in detail.

Figure 11:
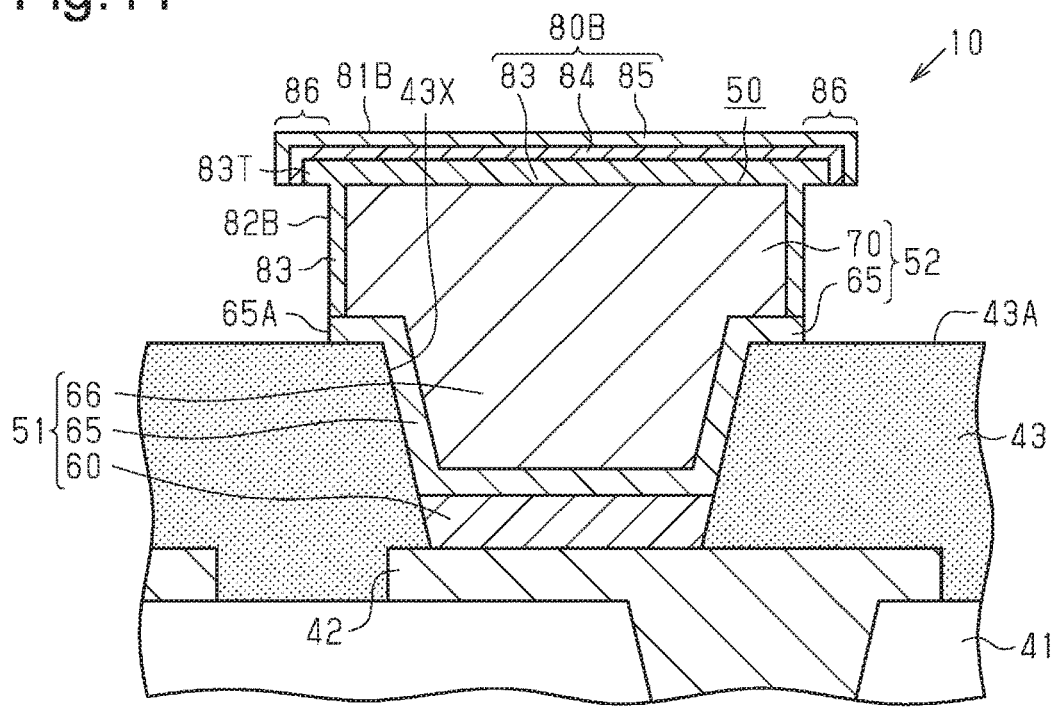
FIG. 11 is an enlarged cross-sectional view of a wiring substrate in accordance with a third embodiment.

Referring to FIG. 11, the outer coating plating layer 80B entirely covers the upper surface and side surface of each metal post 70. The outer coating plating layer 80B includes an upper portion 81B, which entirely covers the upper surface of each metal post 70, and a side portion 82B, which entirely covers a side surface of each metal post 70. The seed layer 65 includes the outer end surface 65A exposed from the side portion 82B. The side portion 82B is thinner than the upper portion 81B.

The upper portion 81B has the structure of a stack (in present example, three-layer structure) formed by using the plating layer 83 as a bottom layer and stacking the plating layers 83, 84, and 85 in this order on the upper surface of the metal post 70. The side portion 82B has a single-layer structure including only the plating layer 83 that entirely covers a side surface of each metal post 70.

The upper portion 81B includes an outer circumferential section defining a projection 86 that projects outward from the outer surface of the side portion 82B. The projection 86 extends along the entire outer circumferential section of the upper portion 81B. The lower surface of the projection 86 is exposed from the side portion 82B throughout the entire outer circumferential section of the upper portion 81B. The planar shape (outer dimensions in a plan view) of the upper portion 81B including the projection 86 is slightly larger than that of the side portion 82B. Accordingly, the upper portion 81B has an overhang structure exposing the lower surface of the outer circumferential section (projection 86) that projects outward from the side portion 82B.

The plating layer 83 continuously covers the entire side surface and entire upper surface of each metal post 70. The plating layer 83 of the upper portion 81B includes a projection 83T that projects outward from the outer surface of the plating layer 83 in the side portion 82B. The plating layer 83 is thinner at the side portion 82B than the upper portion 81B.

The plating layer 84 covers the entire upper surface of the plating layer 83 in the upper portion 81B. Further, the plating layer 84 covers the entire side surface of the projection 83T of the plating layer 83. The plating layer 84 exposes the entire lower surface of the projection 83T and the entire outer surface of the side portion 82B.

The plating layer 85 continuously covers the entire upper surface and entire side surface of the plating layer 84. The plating layer 85 exposes the entire lower surface of the plating layer 84, the entire lower surface of the projection 83T, and the entire outer surface of the side portion 82B.

The projection 86 includes the projection 83T of the plating layer 83 and the plating layers 84 and 85 that cover the upper surface and side surface of the projection 83T. In the projection 86, the lower surface of the projection 83T is substantially flush with the lower surfaces of the plating layers 84 and 85 that cover the side surface of the projection 83T.

A method for manufacturing the wiring substrate 10 in accordance with the third embodiment will now be described. To simplify illustration, portions that will form elements of the wiring substrate 10 are given the same reference characters as the corresponding elements in the final wiring substrate 10.

Figure 12:
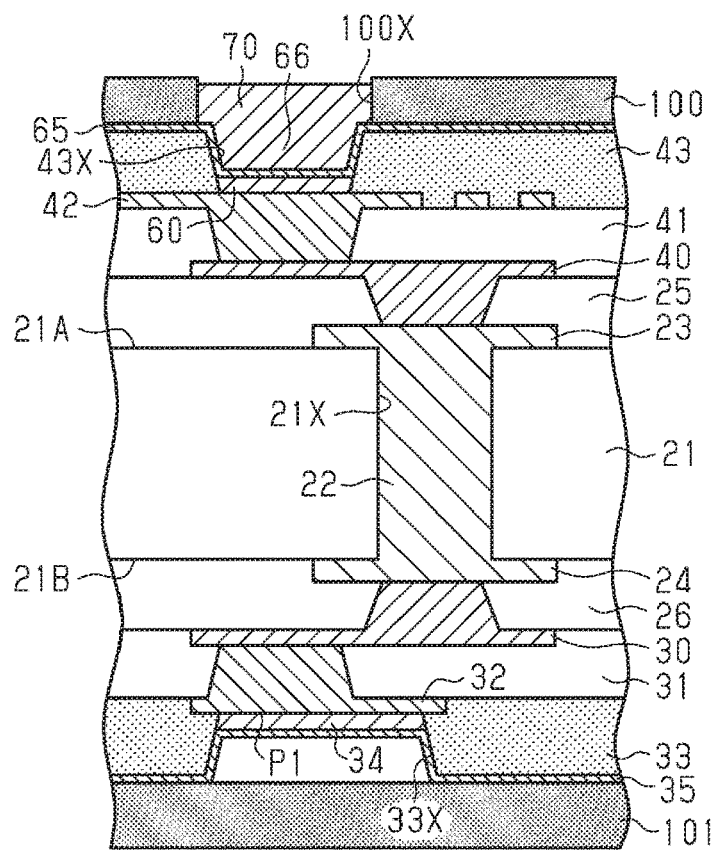
FIGS. 12, 13A, 13B, and 14 are schematic cross-sectional views illustrating a method for manufacturing the wiring substrate illustrated in FIG. 11.

The steps illustrated in FIGS. 3A to 5B are performed to obtain the structure of FIG. 12. In the structure illustrated in FIG. 12, the metal post 70 is formed in the opening pattern 100X of the resist layer 100. The resist layer 100 illustrated in FIG. 12 is thinner than the resist layer 100 illustrated in, for example, FIG. 5B.

Figure 13A:
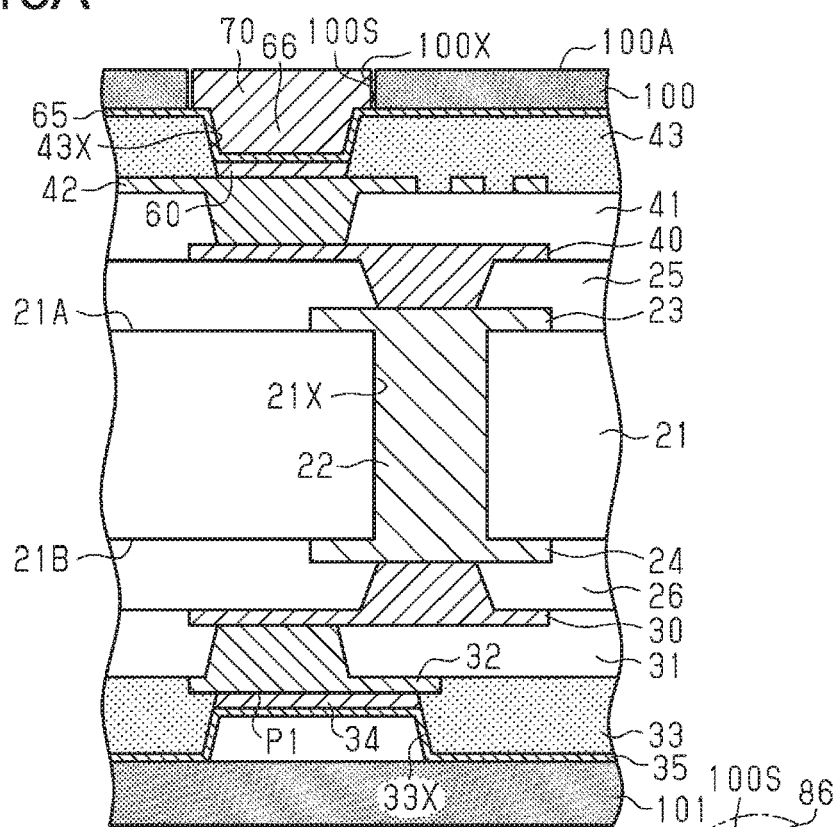

In the same manner as the step of FIG. 6A, in the step illustrated in FIG. 13A, the resist layer 100 is selectively etched to reduce the thickness of the resist layer 100. In the etching step, the metal post 70 (in present example, Cu layer) and the seed layer 65 (in present example, Cu layer) are not etched. This forms the gap 100S between the side surface of the metal post 70 and the wall surface of the opening pattern 100X. The size of the gap 100S is set in accordance with the thickness of the plating layer 83 that is formed in a subsequent step. In the second embodiment, etching is performed so that the upper surface 100A of the resist layer 100, which has been reduced in thickness, is located on the same plane as the upper surface of the metal post 70. Before reducing the thickness of the resist layer 100, the resist layer 100 has a thickness set taking into consideration the reduced amount of the resist layer 100, which is set based on the size of the gap 100S, so that the upper surface of the metal post 70 after the thickness reduction is located on the same plane as the upper surface of the metal post 70.

Figure 13B:
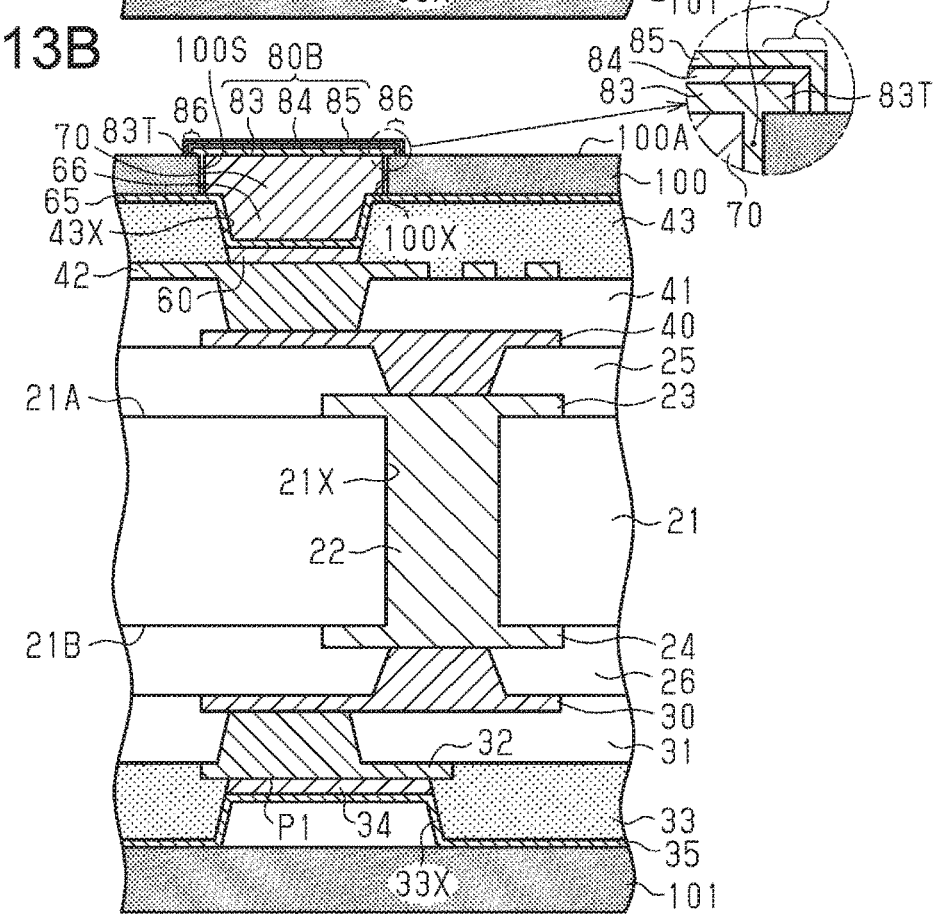

In the step illustrated in FIG. 13B, the outer coating plating layer 80B is formed covering the entire upper surface of the metal post 70 and the entire side surface of the metal post 70, which is exposed to the outside from the gap 100S.

An electrolytic plating process (in present example, electrolytic Ni plating process) is performed to form the plating layer 83 that continuously covers the entire side surface and entire upper surface of the metal post 70. The gap 100S is filled with the plating layer 83. In the present example, after filling the gap 100S with the plating layer 83, deposition of a plating film on the upper surface of the metal post 70 is continued in the electrolytic Ni plating process. The plating film is deposited in an isotropic manner from the plating layer 83 with which the gap 100S is filled and which covers the upper surface of the metal post 70. Thus, the plating layer 83 (i.e., projection 83T) is also formed on the upper surface 100A of the resist layer 100. However, the projection 83T is not adhered (bonded) to the upper surface 100A of the resist layer 100.

Then, an electrolytic plating process (in present example, electrolytic Pd plating process) is performed to form the plating layer 84 that entirely covers the surface of the plating layer 83 exposed from the resist layer 100. Further, an electrolytic plating process (in present example, electrolytic Au plating process) is performed to form the plating layer 85 that entirely covers the surface of the plating layer 84 exposed from the resist layer 100.

Figure 14:
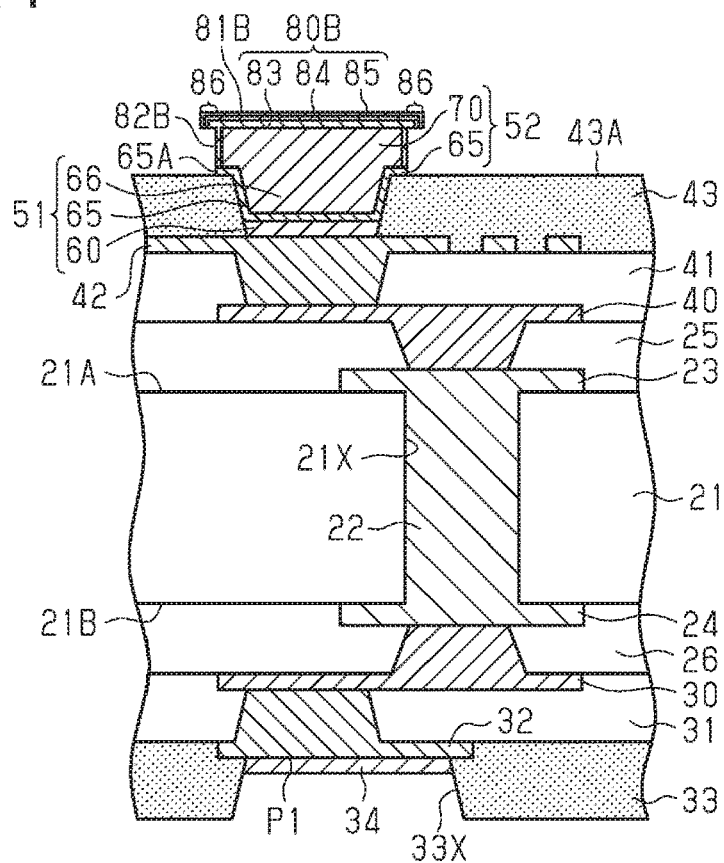

In the step illustrated in FIG. 14, the resist layers 100 and 101 illustrated in FIG. 13B are removed by an alkali delamination liquid in the same manner as in FIG. 7A. Then, in the same manner as the step illustrated in FIG. 7B, wet etching is performed using the outer coating plating layer 80A as an etching mask to remove the unnecessary seed layers 35 and 65. The wiring substrate 10 in accordance with the third embodiment illustrated in FIG. 11 is manufactured through the manufacturing process described above.

In addition to advantages (1) to (4) of the first embodiment and advantages (5) and (6) of the second embodiment, the third embodiment has the advantage described below.

(7) The plating layer 83 of the upper portion 81B includes the projection 83T that projects outward from the outer surface of the plating layer 83 in the side portion 82B. Thus, the planar shape of the upper portion 81B is larger than the planar shape of the side portion 82B. This increases the bonded area of the solder layer 93 and the outer coating plating layer 80B. Accordingly, the connection reliability is improved between the solder layer 93 and the outer coating plating layer 80B (metal post 70). Consequently, the connection reliability is improved between the connection terminal 92 of the semiconductor element 91 and the metal post 70 of the wiring substrate 10.

Fourth Embodiment

A wiring substrate 10 in accordance with a fourth embodiment will now be described with reference to FIGS. 15 to 17B. The wiring substrate 10 of the fourth embodiment includes an outer coating plating layer 80C instead of the outer coating plating layers 80, 80A, and 80B of the first to third embodiments. The description hereafter will focus on differences from the third embodiment. Same reference numerals are given to those components that are the same as the corresponding components illustrated in FIGS. 1A to 14. Such components will not be described in detail.

Figure 15:
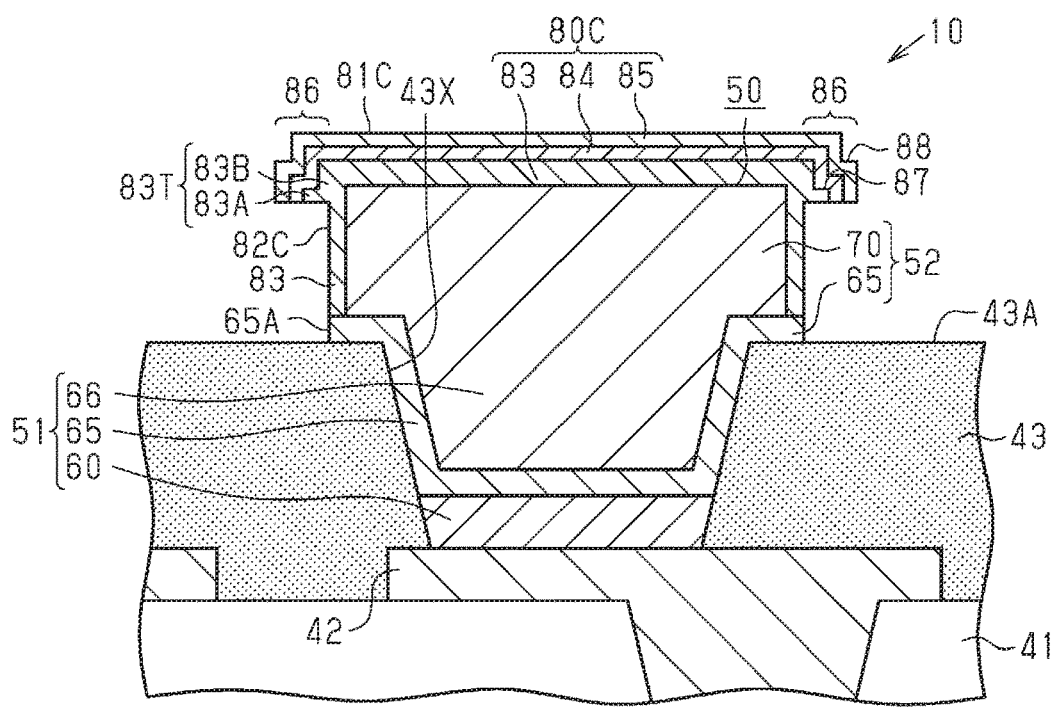
FIG. 15 is an enlarged cross-sectional view of a wiring substrate in accordance with a fourth embodiment.

Referring to FIG. 15, the outer coating plating layer 80C entirely covers the upper surface and side surface of each metal post 70. The outer coating plating layer 80C includes an upper portion 81C, which entirely covers the upper surface of each metal post 70, and a side portion 82C, which entirely covers a side surface of each metal post 70. The seed layer 65 includes the outer end surface 65A exposed from the side portion 82C. The side portion 82C is thinner than the upper portion 81C.

The upper portion 81C has the structure of a stack (in present example, three-layer structure) formed by using the plating layer 83 as a bottom layer and stacking the plating layers 83, 84, and 85 in this order on the upper surface of the metal post 70. The side portion 82C has a single-layer structure including only the plating layer 83 that entirely covers a side surface of each metal post 70.

The upper portion 81C includes an outer circumferential portion forming the projection 86 that projects outward from the outer surface of the side portion 82C. In the present example, the lower surface of the projection 86 is located at a lower position than the upper surface of the metal post 70.

The plating layer 83 continuously covers the entire side surface and entire upper surface of each metal post 70. The plating layer 83 of the upper portion 81C includes the projection 83T that projects outward from the outer surface of the plating layer 83 in the side portion 82C. In the present example, the projection 83T includes a large diameter portion 83A and a small diameter portion 83B having a smaller diameter than the large diameter portion 83A. The large diameter portion 83A extends continuously outward from the outer surface of the plating layer 83 in the side portion 82C, and the small diameter portion 83B is formed on the upper surface of the large diameter portion 83A. The side surface of the projection 83T includes a step 87. The step 87 is formed by the side surface of the large diameter portion 83A, the upper surface of the large diameter portion 83A, the side surface of the small diameter portion 83B, and the upper surface of the small diameter portion 83B. The planar shape of the small diameter portion 83B (outer dimensions in a plan view) is larger than that of the side portion 82C.

The plating layer 84 covers the entire upper surface of the plating layer 83. Further, the plating layer 84 covers the entire stepped surface of the step 87 in the projection 83T. The plating layer 84 exposes the entire lower surface of the projection 83T.

The plating layer 85 continuously covers the entire upper surface and entire side surface of the plating layer 84 and entirely exposes the entire lower surface of the plating layer 84 and the entire lower surface of the projection 83T.

The projection 86 includes the projection 83T of the plating layer 83 and the plating layers 84 and 85 that cover the upper surface and side surface of the step 87 of the projection 83T. In the same manner as the step 87 of the projection 83T, the side surface of the projection 86 forms a step 88. In the projection 86, the lower surface of the projection 83T is substantially flush with the lower surfaces of the plating layers 84 and 85 that cover the side surface of the large diameter portion 83A.

A method for manufacturing the wiring substrate 10 in accordance with the fourth embodiment will now be described. To simplify illustration, portions that will form elements of the wiring substrate 10 are given the same reference characters as the corresponding elements in the final wiring substrate 10.

Figure 16A:
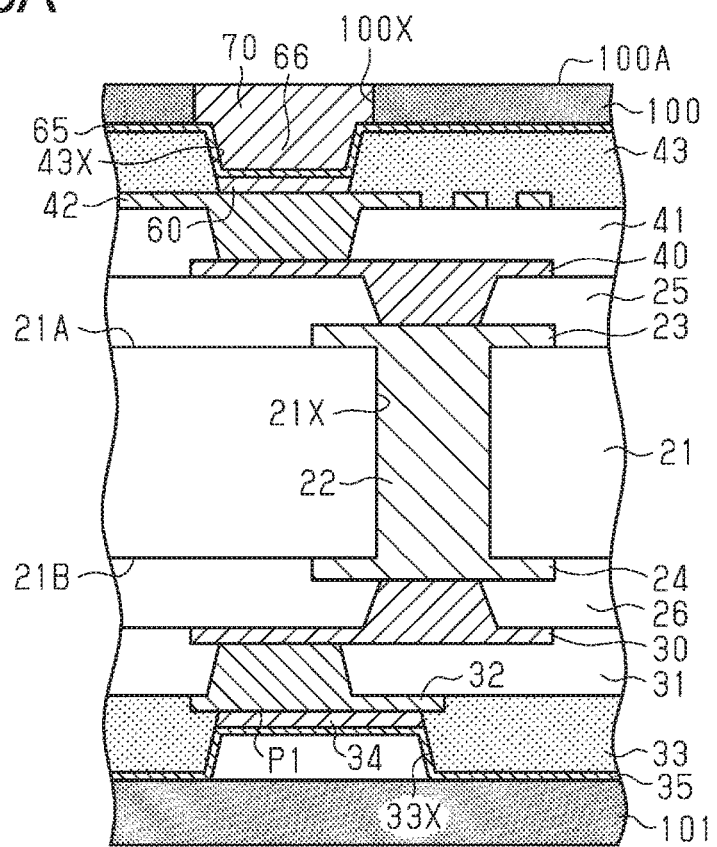
FIGS. 16A, 16B, 17A, and 17B are schematic cross-sectional views illustrating a method for manufacturing the wiring substrate illustrated in FIG. 15.

The steps illustrated in FIGS. 3A to 5B are performed to obtain the structure of FIG. 16A. In the structure illustrated in FIG. 16A, the metal post 70 is formed in the opening pattern 100X of the resist layer 100. The resist layer 100 illustrated in FIG. 16A is thinner than the resist layer 100 illustrated in, for example, FIG. 5B. In the present example, the thickness of the resist layer 100 is set to be substantially the same as the thickness of the metal post 70.

Figure 16B:
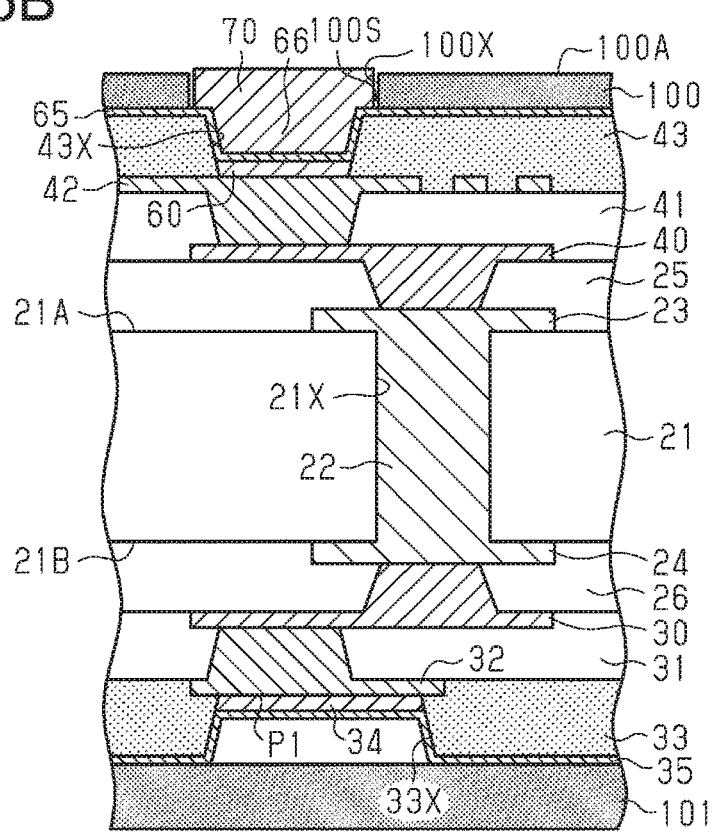

In the same manner as the step of FIG. 6A, in the step illustrated in FIG. 16B, the resist layer 100 is selectively etched to reduce the thickness of the resist layer 100. In the etching step, the metal post 70 (in present example, Cu layer) and the seed layer 65 (in present example, Cu layer) are not etched. This forms the gap 100S between the side surface of the metal post 70 and the wall surface of the opening pattern 100X. The size of the gap 100S is set in accordance with the thickness of the plating layer 83 that is formed in a subsequent step. In the fourth embodiment, etching is performed so that the upper surface 100A of the resist layer 100, which has been reduced in thickness, is located at a lower position than the upper surface of the metal post 70. Before reducing the thickness of the resist layer 100, the resist layer 100 has a thickness set taking into consideration the reduced amount of the resist layer 100, which is set based on the size of the gap 100S, so that the upper surface subsequent to the thickness reduction is located at a lower position than the upper surface of the metal post 70.

Figure 17A:
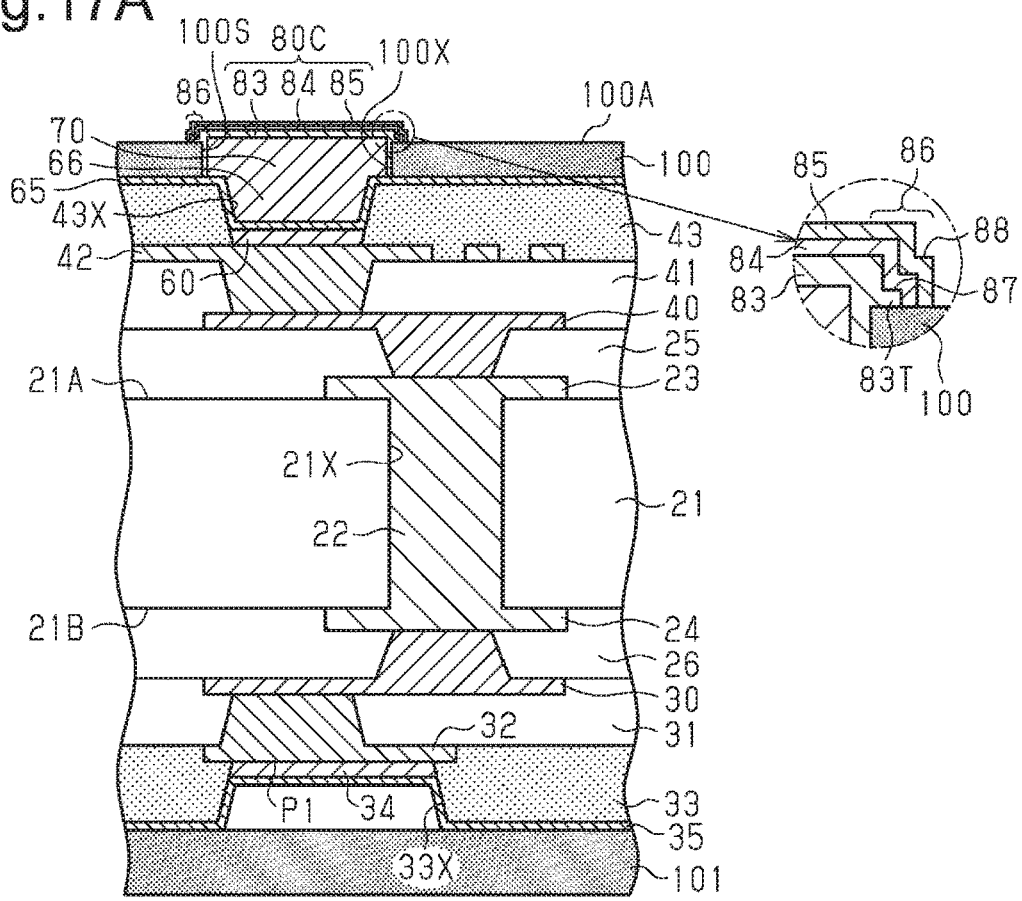

In the step illustrated in FIG. 17A, the outer coating plating layer 80C is formed covering the entire upper surface of the metal post 70 and the entire side surface of the metal post 70, which is exposed to the outside from the gap 100S.

An electrolytic plating process (in present example, electrolytic Ni plating process) is performed to form the plating layer 83 that continuously covers the entire side surface and entire upper surface of the metal post 70. The gap 100S is filled with the plating layer 83. In the present example, after filling the gap 100S with the plating layer 83, deposition of a plating film on the upper surface of the metal post 70 is continued in the electrolytic Ni plating process. The plating film is deposited in an isotropic manner from the plating layer 83 with which the gap 100S is filled and which covers the upper surface of the metal post 70. Thus, the plating layer 83 (i.e., projection 83T) is also formed on the upper surface 100A of the resist layer 100. Further, the step between the upper surface 100A of the resist layer 100 and the upper surface of the metal post 70 forms the step 87 in the projection 83T. The projection 83T is not adhered (bonded) to the upper surface 100A of the resist layer 100.

Then, an electrolytic plating process (in present example, electrolytic Pd plating process) is performed to form the plating layer 84 that entirely covers the surface of the plating layer 83 exposed from the resist layer 100. Further, an electrolytic plating process (in present example, electrolytic Au plating process) is performed to form the plating layer 85 that entirely covers the surface of the plating layer 84 exposed from the resist layer 100.

Figure 17B:
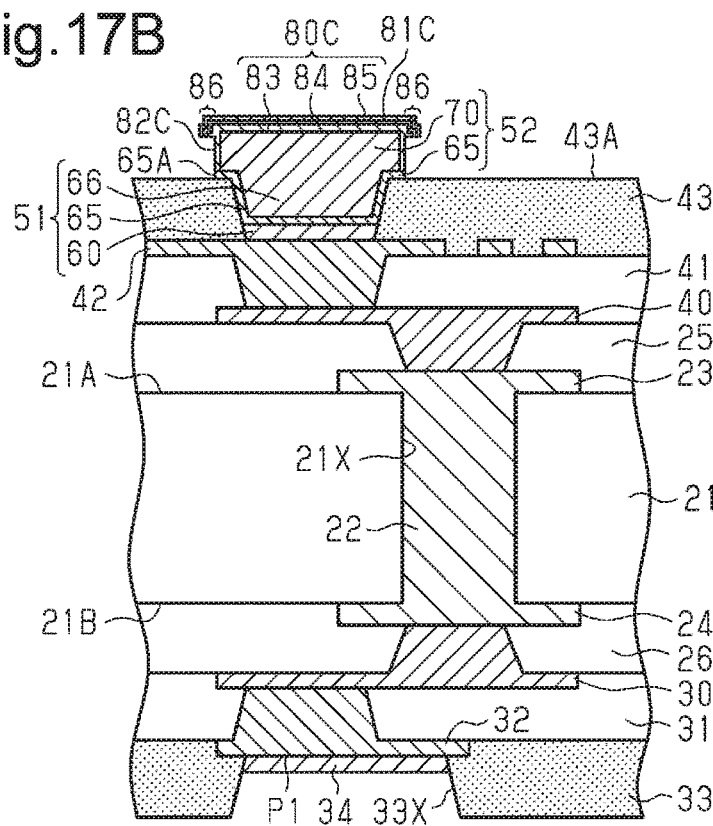

In the step illustrated in FIG. 17B, the resist layers 100 and 101 illustrated in FIG. 17A are removed by an alkali delamination liquid in the same manner as in FIG. 7A. Then, in the same manner as the step illustrated in FIG. 7B, wet etching is performed using the outer coating plating layer 80C as an etching mask to remove the unnecessary seed layers 35 and 65. The wiring substrate 10 in accordance with the fourth embodiment illustrated in FIG. 15 is manufactured through the manufacturing process described above.

In addition to advantages (1) to (4) of the first embodiment, advantages (5) and (6) of the second embodiment, and advantage (7) of the third embodiment, the fourth embodiment has the advantage described below.

(8) The upper portion 81C of the outer coating plating layer 80C includes the projection 86 that projects outward from the outer surface of the side portion 82C. The side surface of the projection 86 includes the step 88. Thus, for example, the solder layer 93 is bonded to the side surface of the step 88 (in present example, side surface of plating layer 85 covering side surface of small diameter portion 83B). This increases the bonded area of the outer coating plating layer 80C and the solder layer 93. Accordingly, the connection reliability is improved between the solder layer 93 and the outer coating plating layer 80C (metal post 70). Consequently, the connection reliability is improved between the connection terminal 92 of the semiconductor element 91 and the metal post 70 of the wiring substrate 10.

It should be apparent to those skilled in the art that the foregoing embodiments may be implemented in many other specific forms without departing from the scope of this disclosure. Particularly, it should be understood that the foregoing embodiments may be implemented in the following forms.

The above-described embodiments and the modified examples described below may be combined as long as there is no technical contradiction.

In the fourth embodiment, the projection 86 of the outer coating plating layer 80C includes the step 88. Instead, for example, the side surface of the projection 86 may include a curved surface.

In the second to fourth embodiments, the upper portions 81A, 81B, and 81C of the outer coating plating layers 80A, 80B, and 80C have structures of stacks formed by stacking an Ni layer (plating layer 83), a Pd layer (plating layer 84), and an Au layer (plating layer 85) in this order on the upper surface of each metal post 70. Instead, for example, the upper portions 81A, 81B, and 81C may be formed on the upper surface of the metal post 70 by a stack structure that stacks an Ni layer and an Au layer in this order, a stack structure that stacks an Ni layer, a Pd layer, and an Ag layer in this order, or a stack structure that stacks an Ni layer, a Pd layer, an Ag layer, and an Au layer in this order.

In the second to fourth embodiments, the side portions 82A, 82B, and 82C of the outer coating plating layers 80A, 80B, and 80C each have a single-layer structure including only the plating layer 83 that entirely covers a side surface of each metal post 70. Instead, for example, the side portions 82A, 82B, and 82C may each have the structure of a stack formed by stacking a plurality of plating layers. For example, the side portions 82A, 82B, and 82C may be formed on the side surface of the metal post 70 by a stack structure that stacks an Ni layer and an Au layer in this order or a stack structure that stacks an Ni layer, a Pd layer, and an Ag layer in this order.

When the side portion 82A has a stack structure that stacks an Ni layer and a Pd layer in this order, the upper portion 81A may have a stack structure that stacks, for example, an Ni layer, a Pd layer, and an Au layer in this order. When the side portion 82A has a stack structure that stacks an Ni layer, a Pd layer, and an Ag layer in this order, the upper portion 81A may have a stack structure that stacks, for example, an Ni layer, a Pd layer, an Ag layer, and an Au layer in this order. In any case, the Au layer is formed in only the upper portion 81A.

In each of the above embodiments, the outer end surface 65A of the seed layer 65 is flush with the outer surfaces of the side portions 82, 82A, 82B, and 82C in the outer coating plating layers 80, 80A, 80B, and 80C. However, the location and shape of the outer end surface 65A of the seed layer 65 may be changed.

Figure 18:
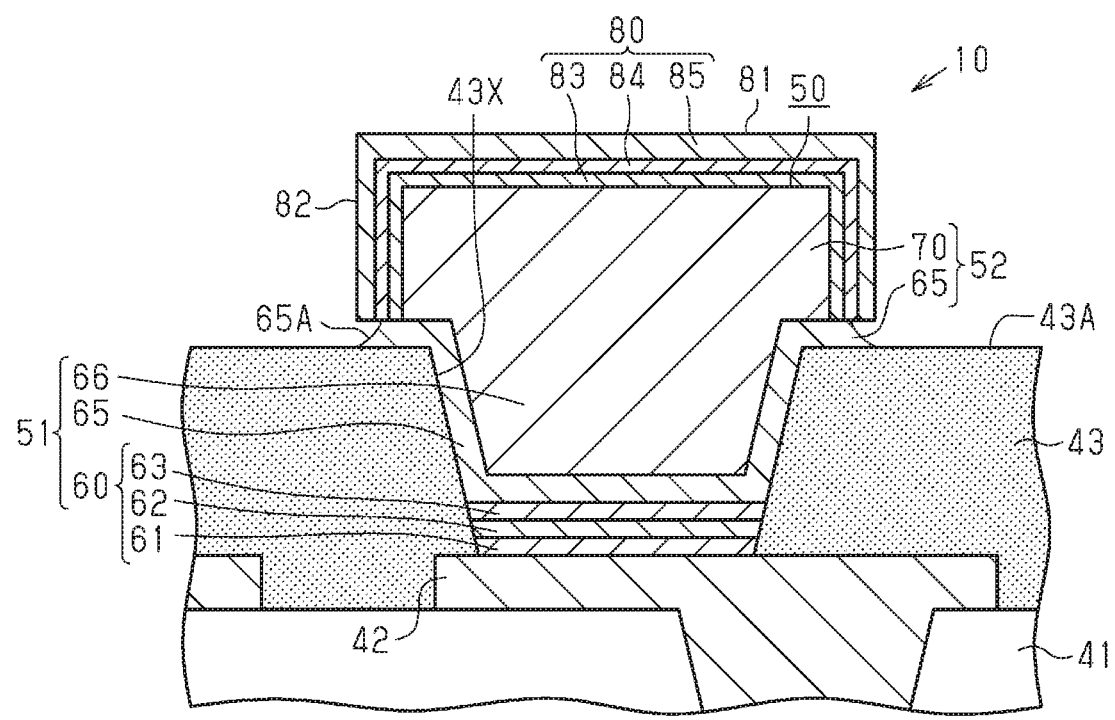
FIG. 18 is an enlarged cross-sectional view illustrating a wiring substrate of a modified example.

For example, as illustrated in FIG. 18, the outer end surface 65A of the seed layer 65 may be arranged toward the inner side of the metal post 70 from the outer surface of the side portion 82 in the outer coating plating layer 80. In this case, the lower surface of the outer coating plating layer 80 is partially exposed from the seed layer 65. However, in this case, the seed layer 65 entirely covers the lower surface of the metal post 70 so that the lower surface of the metal post 70 is not exposed to the outside. This configuration effectively prevents projection of the seed layer 65 toward the outer side from the outer surface of the side portion 82 of the outer coating plating layer 80. Thus, even when the pitch is narrowed between the metal posts 70, short-circuiting of adjacent metal posts 70 (outer coating plating layer 80) is limited. The seed layer 65 may be modified in the same manner in the second to fourth embodiments.

The diffusion prevention layer 60 may be omitted in each of the above embodiments. In this case, for example, the seed layer 65 is formed to continuously cover the entire wall surface of the opening 43X (in the example of FIG. 1B, entire upper surface of wiring layer 42 exposed in opening 43X and entire wall surface of opening 43X) and the entire upper surface 43A of the solder resist layer 43.

The diffusion prevention layer 34 may be omitted in each of the above embodiments. In this case, the external connection terminal 96 is formed on, for example, the lower surface of the wiring layer 32 (i.e., external connection pad P1) exposed in the opening 33X of the solder resist layer 33.

In each of the above embodiments, electroless plating process (e.g., electroless copper plating process) is performed to form the seed layers 35 and 65. Instead, a sputtering process or a vapor deposition process may be performed to form the seed layers 35 and 65.

In each of the above embodiments, the seed layers 35 and 65 each have a single-layer structure but instead may have a stack structure (e.g., double-layer structure). One example of a double-layer structure includes a structure sequentially stacking a titanium (Ti) layer and a Cu layer.

Instead of mounting the semiconductor element 91 on the wiring substrate 10, another electric component, for example, a chip component such as a chip capacitor, a chip resistor, or a chip inductor, or a crystal oscillator may be mounted on the wiring substrate 10.

In each of the above embodiments, the inner layer structure between the wiring layers 32 and 42 in the thicknesswise direction of the wiring substrate 10 is not particularly limited. As long as the inner layer structure electrically connects the wiring layers 32 and 42 to each other, the wiring substrate 10 may have any inner layer structure. For example, the structure and material of the core substrate 21 is not particularly limited. Further, there is no limit to the number of internal wiring layers (e.g., wiring patterns 23 and 24) formed on the core substrate 21 and the number of insulation layers (e.g., insulation layers 25 and 26) covering the internal wiring layers. The number of wiring layers and insulation layers stacked on the upper surface and lower surface of the substrate body 20 is also not particularly limited. Instead of a cored build-up substrate including the core substrate 21, the wiring substrate 10 may be a coreless substrate that is less the core substrate 21.

Clauses

This disclosure further encompasses the following embodiments.

1. A method for manufacturing a wiring substrate, the method including:

forming a wiring layer;

forming an insulation layer that covers the wiring layer;

forming an opening in the insulation layer to partially expose an upper surface of the wiring layer;

forming a seed layer that continuously and entirely covers a wall surface of the opening and an upper surface of the insulation layer;

forming a resist layer on the seed layer, the resist layer including an opening pattern;

performing an electrolytic copper plating process through the opening pattern to form a metal layer on the seed layer located in the opening so that the opening is filled with the metal layer and the seed layer;

continuously performing the electrolytic copper plating process through the opening pattern to form a metal post on an upper surface of the metal layer and the seed layer that is located on the upper surface of the insulation layer;

forming a gap between a side surface of the metal post and a wall surface of the opening pattern by performing plasma etching on the resist layer;

forming an outer coating plating layer by performing an electrolytic plating process, wherein the outer coating plating layer includes an upper portion entirely covering an upper surface of the metal post and a side portion entirely covering the side surface of the metal post, and the gap is filled with the side portion;

removing the resist layer; and removing the seed layer by performing etching using the outer coating plating layer as a mask, wherein the forming an outer coating plating layer includes forming the side portion thinner than the upper portion.

2. The method according to clause 1, wherein the forming an outer coating plating layer includes filling the gap with the side portion of the outer coating plating layer.

3. The method according to clause 1, wherein the forming an outer coating plating layer includes:

forming a first plating layer with which the gap is filled by performing an electrolytic plating process, wherein the first plating layer entirely covers the side surface of the metal post and entirely covers the upper surface of the metal post; and forming a second plating layer from a metal that differs from that of the first plating layer by performing an electrolytic plating process, wherein the second plating layer entirely covers an upper surface of the first plating layer.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A wiring substrate comprising:

a wiring layer;

an insulation layer covering the wiring layer and including an opening that partially exposes an upper surface of the wiring layer;

a seed layer continuously covering a wall surface of the opening and an upper surface of the insulation layer;

a metal layer formed by a first copper plating layer on the seed layer covering the wall surface of the opening, wherein the opening is filled with the seed layer covering the wall surface of the opening and the metal layer;

a metal post formed by a second copper plating layer on an upper surface of the metal layer and on the seed layer that is located on the upper surface of the insulation layer; and an outer metal layer exposing an outer end surface of the seed layer located on the upper surface of the insulation layer, the outer metal layer including:

an upper portion entirely covering an upper surface of the metal post, and a side portion entirely covering a side surface of the metal post from an upper most end to a lower most end of the side surface and contacting an upper surface of the seed layer located on the upper surface of the insulation layer, wherein the outer end surface of the seed layer is arranged toward an inner side of the metal post from an outer surface of the side portion, and wherein the side portion includes a bottom end surface, wherein a portion of the bottom end surface is contacted with the seed layer and the other portion of the bottom end surface is exposed from the seed layer.

2. The wiring substrate according to claim 1, wherein the side portion and the upper portion have different layer structures.

3. The wiring substrate according to claim 2, wherein the side portion has a single-layer structure including only a first plating layer, and the upper portion has a structure of a stack including the first plating layer and a second plating layer formed from a metal differing from that of the first plating layer.

4. The wiring substrate according to claim 3, wherein the first plating layer is formed from nickel or a nickel alloy, and the second plating layer is formed from gold or a gold alloy.

5. The wiring substrate according to claim 3, wherein the first plating layer is thinner at the side portion than the upper portion.

6. The wiring substrate according to claim 3, wherein the structure of the stack of the upper portion further includes a third plating layer located between the first plating layer and the second plating layer and formed from a metal that differs from that of each of the first and second plating layers.

7. The wiring substrate according to claim 1, wherein the side portion and the upper portion are formed by a plurality of plating metals, and one of the plurality of plating metals is thinner at the side portion than the upper portion.

8. The wiring substrate according to claim 1, wherein the upper portion includes an outer circumferential portion forming a projection that projects outward from an outer surface of the side portion.

9. The wiring substrate according to claim 8, wherein the projection includes a side surface forming a step.

10. The wiring substrate according to claim 1, further comprising:
   a diffusion prevention layer formed by a plating metal layer and arranged on the upper surface of the wiring layer exposed in the opening, wherein
   a lower portion of the opening is filled with the diffusion prevention layer, and
   the seed layer continuously covers an upper surface of the diffusion prevention layer, the wall surface of the opening, and the upper surface of the insulation layer.

11. A semiconductor device comprising:
   the wiring substrate according to claim 1; and
   a semiconductor element connected to the metal post.

12. The wiring substrate according to claim 1, wherein the side portion of the outer metal layer is thinner than the upper portion of the outer metal layer.

* * * * *